US009936595B2

(12) United States Patent
Hunt et al.

(10) Patent No.: US 9,936,595 B2
(45) Date of Patent: Apr. 3, 2018

(54) WIRE RETENTION COVER FOR PRINTED CIRCUIT BOARDS IN AN ELECTRONIC DEVICE

(71) Applicant: THOMSON LICENSING, Issy-les Moulineaux (FR)

(72) Inventors: Mickey Hunt, Camby, IN (US); William P. Dernier, Indianapolis, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days.

(21) Appl. No.: 15/357,328

(22) Filed: Nov. 21, 2016

(65) Prior Publication Data
US 2017/0150629 A1 May 25, 2017

Related U.S. Application Data

(60) Provisional application No. 62/258,595, filed on Nov. 23, 2015.

(51) Int. Cl.
| | |
|---|---|
| *H01R 4/70* | (2006.01) |
| *H05K 5/03* | (2006.01) |
| *H05K 1/02* | (2006.01) |
| *H05K 7/14* | (2006.01) |
| *H05K 1/11* | (2006.01) |
| *H05K 1/18* | (2006.01) |
| *H01Q 1/38* | (2006.01) |
| *H01Q 1/22* | (2006.01) |
| *H01Q 13/10* | (2006.01) |

(52) U.S. Cl.
CPC ............. *H05K 5/03* (2013.01); *H01Q 1/2258* (2013.01); *H01Q 1/38* (2013.01); *H01Q 13/10* (2013.01); *H05K 1/0203* (2013.01); *H05K 1/117* (2013.01); *H05K 1/18* (2013.01); *H05K 7/1417* (2013.01)

(58) Field of Classification Search
CPC ...... H05K 5/03; H05K 1/0203; H05K 7/1417; H05K 1/117; H05K 1/18; H01Q 1/38; H01Q 1/2258; H01Q 13/10
USPC .................................................... 174/138 F
See application file for complete search history.

(56) References Cited

U.S. PATENT DOCUMENTS

| | | | |
|---|---|---|---|
| 2009/0200066 A1 | 8/2009 | Vicard et al. | |
| 2009/0215292 A1 | 8/2009 | Rueggen et al. | |
| 2011/0149540 A1 | 6/2011 | Brun et al. | |
| 2014/0157868 A1* | 6/2014 | Ward | G01M 15/10 73/23.31 |

FOREIGN PATENT DOCUMENTS

| | | |
|---|---|---|
| EP | 1113533 | 7/2001 |
| JP | 2000252604 | 9/2000 |
| JP | 2013128023 | 6/2013 |

* cited by examiner

*Primary Examiner* — Sherman Ng
(74) *Attorney, Agent, or Firm* — Richard Laperuta; Jerome G. Schaefer

(57) ABSTRACT

A wire retention cover for an antenna mounting arrangement within an electronic device is configured to be positioned over an edge of a printed circuit board and protect the antenna wires and connectors on the connector side thereof. A non-connector side portion or leg of the cover includes one or more slots for receiving antenna wires. A connector side portion or leg of the cover includes raised and lowered portions. The raised portions are configured to cover and protect antenna wire connections to the PCB.

15 Claims, 35 Drawing Sheets

WIRE RETENTION COVER FOR PRINTED CIRCUIT BOARDS IN AN ELECTRONIC DEVICE

CROSS REFERENCE TO RELATED APPLICATIONS

This application claims priority from U.S. Provisional Application Ser. No. 62/258,595 filed on Nov. 23, 2015.

FIELD

The present principles relate generally to electronics and, more particularly, it relates to a wire retention cover for an antenna mounting arrangement within an electronic device.

BACKGROUND

The present disclosure is an improvement to known electronic apparatuses or devices. The devices can be set-top boxes and are typically assembled apparatuses having a plurality of walls and other components. The devices can include components such as printed circuit boards, heat sinks or heat spreader, wires, hard drives, smart card assemblies, and antennas. The plurality of walls and components make the assembly of these devices quite challenging in high volume manufacturing environments. As such, there is a need to insure that the components are staged, mounted, and installed in a manner that is fast and safe for the components. Further, there is a need to insure that the components are capable of being inspected and designed in a manner that makes their installation as reversible as possible for rework in the factory or in the field.

As such, some devices such as a vertically oriented set top box incorporate screwless attachment concepts to assemble the housings of the devices in such a way that the access to the devices in the field can be performed in a safe efficient manner by an authorized person without the need to undue screws. Such designs make gaining access to the interior components of these devices more convenient and reduce excessive handling.

The casings of the vertically oriented set top boxes and gateway devices are relatively tall. The bases are generally narrow. With such geometry, these designs present more challenges than the horizontally oriented set top boxes for screwless housing assembly. The reason being it is difficult to include a locking mechanism in these tall boxes that can extend from the top side to the bottom side of the boxes, and yet still be able to house the plurality of necessary components which can include a plurality of antennas without interfering with the locking mechanism.

The need for a plurality of antennas in these vertically oriented set top boxes or gateway devices particularly presents a challenge. The problem is that in some designs up to 7 antennas are required, which means that additional wires must be used to connect the antennas to a circuit board, and additional fixtures or antenna supports must be installed in the devices to support the antennas. Further, the antennas not only involve extra handling of the work product in the factory that place other components at risk and drive up manufacturing cost, but also these antennas have a propensity for electrostatic discharge in use. As such, designers must ensure that the antennas are adequately shielded in these devices which tend to be quite crowded. Thus, the need exists for an antenna mounting system that is commensurate with the screwless attachment concepts and yet do not pose the risk of electrostatic discharge to and from the antennas.

SUMMARY

According to an implementation, the cover in an electronic device includes a cover having a U-shape configured to fit over an edge of a printed circuit board. The U-shape cover further includes a first leg which is a non-connector side portion having at least one slot positioned at a point along the first leg. The at least one slot being configured to receive an antenna wire. The second leg is a connector side portion having a plurality of raised surfaces and a plurality of lower surfaces. The raised surfaces fit over and protect antenna wires and antenna wire connectors.

According to another implementation, a cover for a printed circuit board contained within an electronic device is provided. The printed circuit board having a connector side and a non-connector side. The wire retention cover includes a first leg configured to be positioned on the non-connector side of the printed circuit board. The first leg has at least one slot positioned at a point along the first leg for receiving an antenna wire. A second leg, connected to the first leg, is configured to be positioned on the connector side of the printed circuit board. A base portion connects the first leg to the second leg. The base portion covering an edge of the printed circuit board when the cover is installed.

According to a further implementation, an electronic device includes a printed circuit board having wire securing slots along an edge of the printed circuit board and electrical connectors on an upper side of the printed circuit board adjacent to the edge. The electronic components have wires extending therefrom, the wires each being secured in one of the wire securing slots and connected to one of the electrical connectors. The cover has a first leg and a second leg. The first leg of the cover overlays the wires extending through the wire securing slots on the first leg of the printed circuit board, and the second leg overlays an opposite side of the printed circuit board.

These and other aspects, features and advantages of the present principles will become apparent from the following detailed description of exemplary embodiments, which is to be read in connection with the accompanying drawings.

BRIEF DESCRIPTION OF THE DRAWINGS

The present principles can be better understood in accordance with the following exemplary figures, in which.

DESCRIPTION OF EMBODIMENTS

The current principles prevent antenna wires from becoming unplugged during the assembly process, promote bend radius of wires to be a preselected value (e.g. 5 mm radius for some applications), improve antenna performance, and insure the coaxial connectors are completely engaged.

Figure 1:
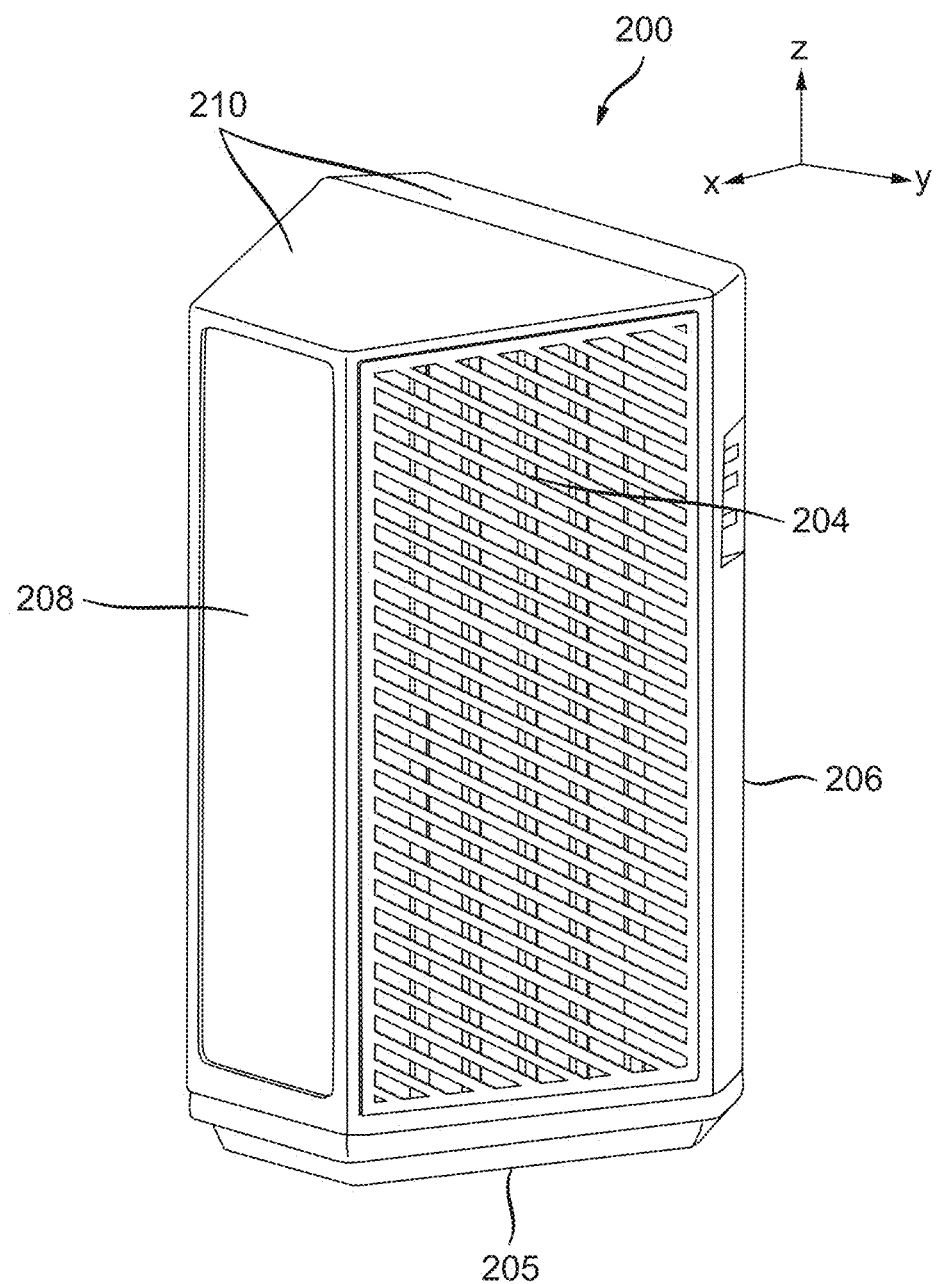
FIG. 1 is a perspective view of a vertically oriented electronic device to which the current principles are applied.

FIG. 1 shows a perspective view of a vertically oriented electronic device 200 that houses an antenna bracket 601 and antennas 602 (not shown in this figure). The device can include a top 210, a front wall 208, a rear wall 206, side walls 204, and a base 205.

Figure 2:
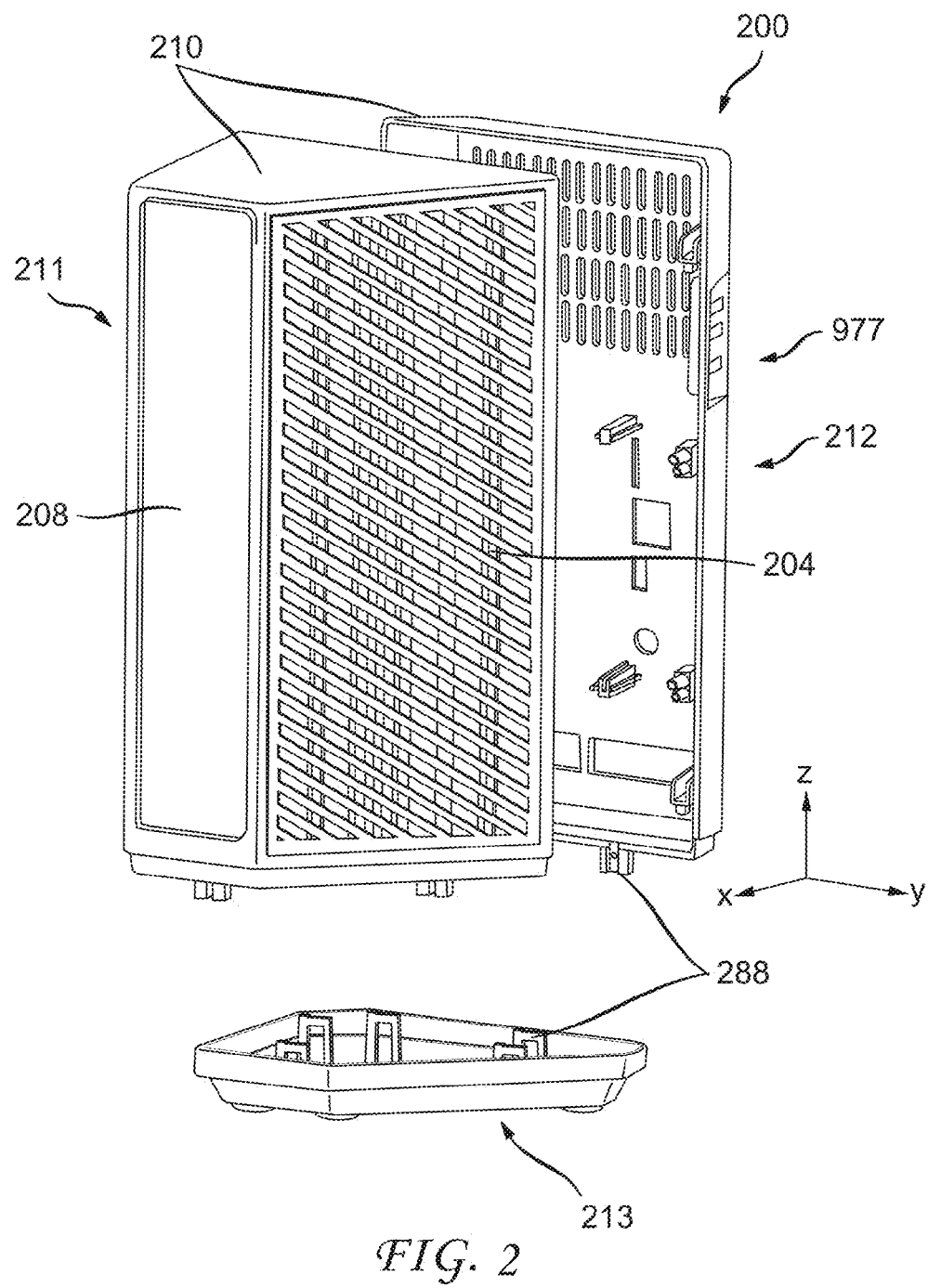
FIG. 2 is a disassembled perspective view of the vertically oriented electronic device of FIG. 1.

FIG. 2 shows the three principal pieces of the vertically oriented electronic device 200. The three pieces are the case bottom piece 213, the case top front piece 211, and the case top back piece 212. The case top front piece 211 and the case top back piece 212 are upper parts of the device 200.

Figure 3:
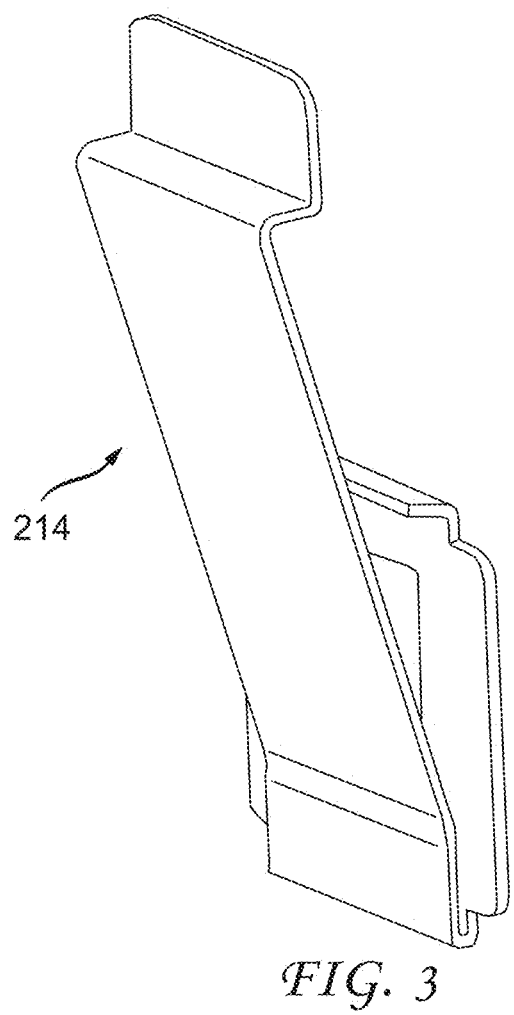
FIG. 3 is a perspective view of a retention clip according to an implementation of the present principles.

FIG. 3 is a perspective view of a retention clip 214 which can be optionally composed of metal and is utilized to engage and secure the case bottom piece 213 to the case top front piece 211 and/or the case top back piece 212. The retention clip 214 is positioned toward the bottom of the electronic device and is a useful part of the locking mechanism applied on the electronic device.

As will be described in further detail below with reference to FIGS. 11 and 12-18, by having the retention clip 214 at the bottom, the antenna bracket 601 and the antennas 602 can be positioned at the other end of the electronic device; hence, the antenna bracket 601 (shown in FIG. 36 at the top end of the rear wall 206) and the antennas 602 do not interfere with locking and/or unlocking of the electronic device. Additionally, the use of the retention clip 214 in concert with other features to be described permits easy access to the antenna bracket 601 and the antennas 602 when needed. The retention clip 214 can be part of a screwless locking mechanism positioned adjacent to the base 205 of the electronic device and can be remote from the antennas in the antenna bracket 601, especially when they are positioned adjacent to the top 210.

Figure 4:
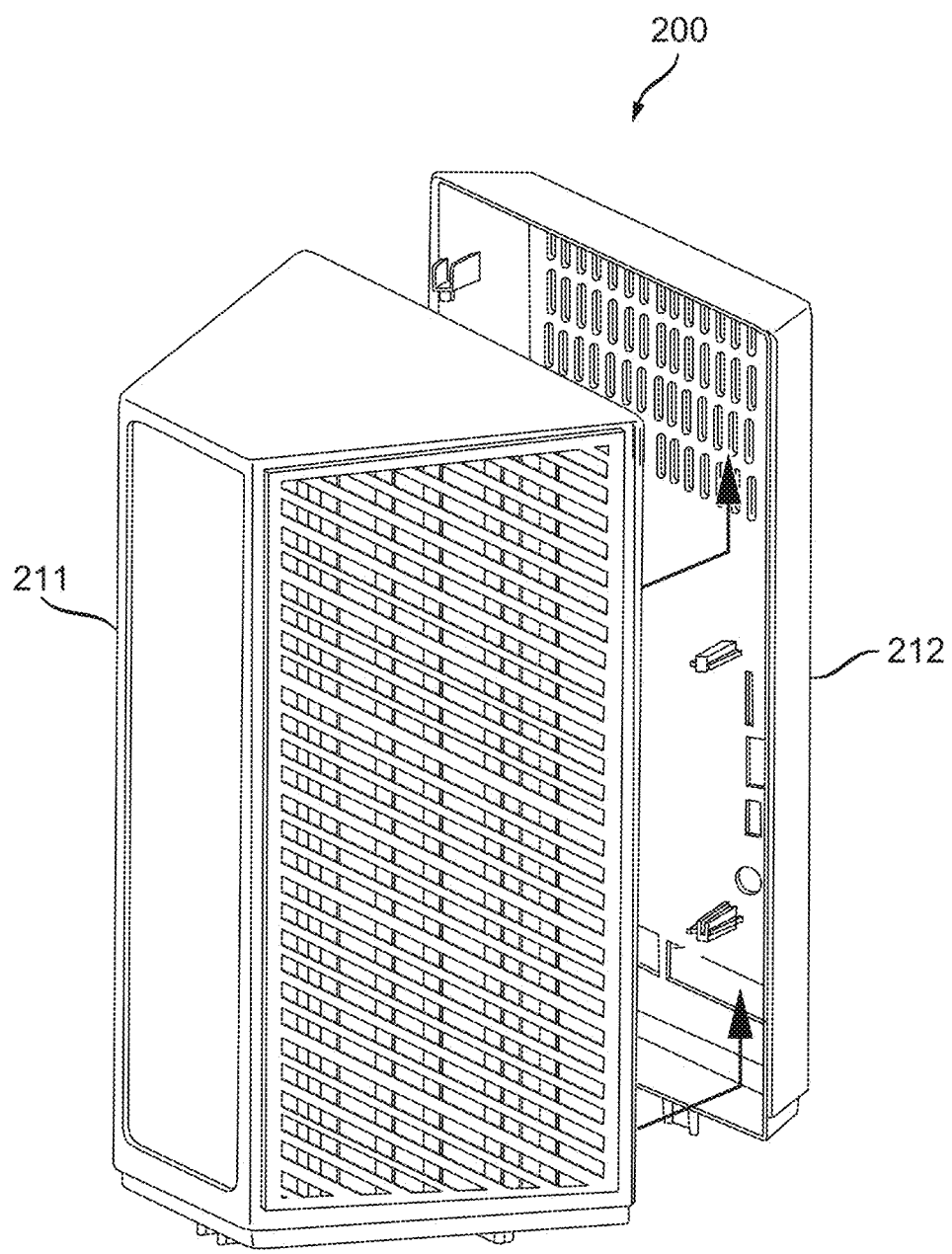
FIG. 4 is a perspective view of an electronic device casing that shows how the pieces of the casing are assembled.

FIG. 4 shows how the case top front piece 211 is slid back onto the case top back piece 212 of the electronic device 200, and then up into retaining elements in order to lock the two pieces together such that internal electronic components can be housed therein when the assembly is finalized.

Figure 5:
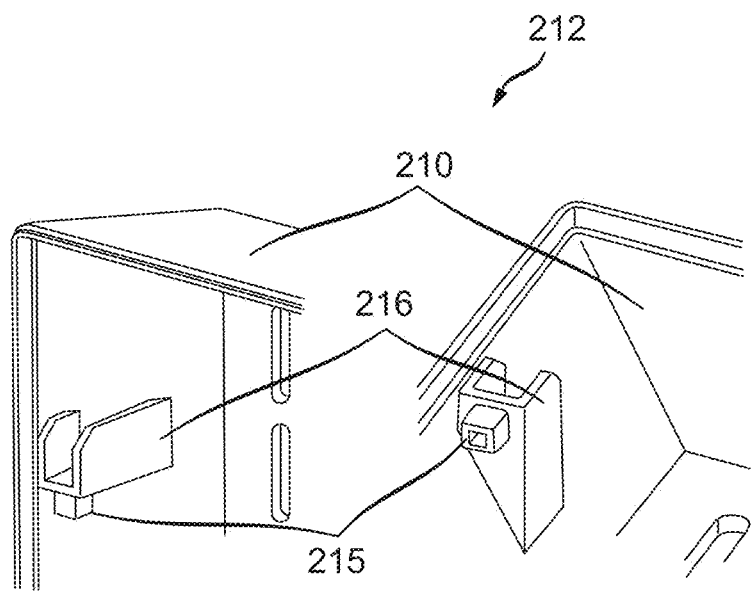
FIG. 5 is a perspective view of an electronic device casing that shows a case back retaining element.
Figure 6:
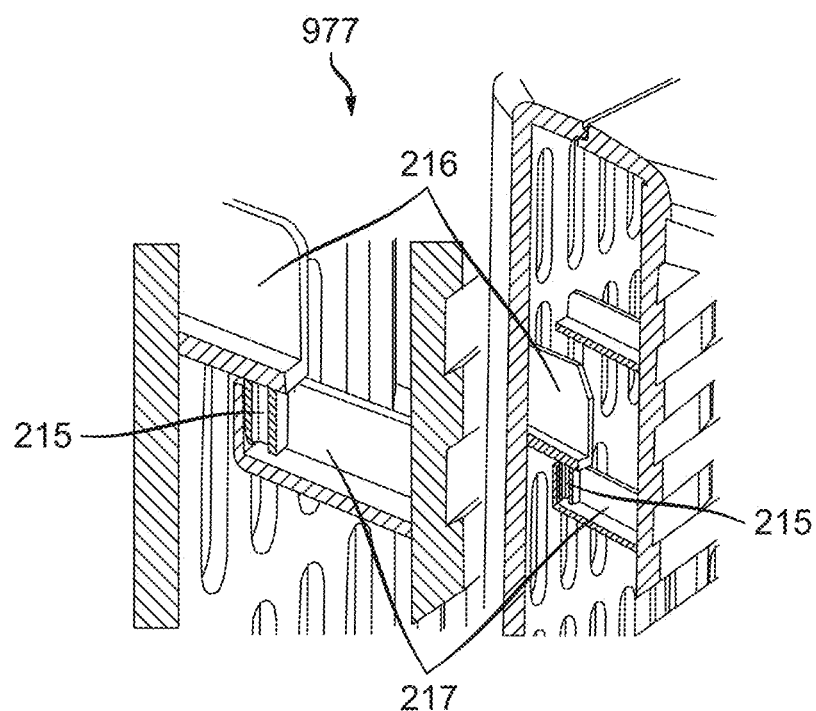
FIG. 6 is a perspective view of an electronic device casing that shows a cross-section of an interlock.
Figure 7:
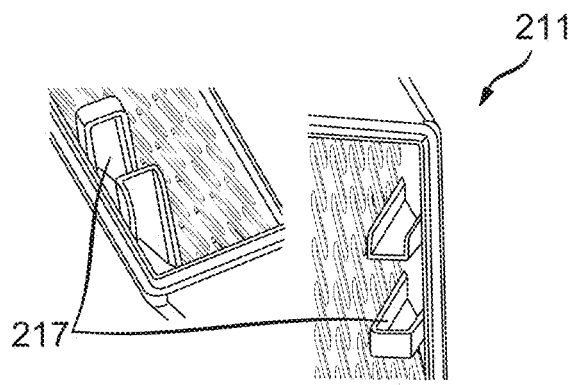
FIG. 7 is a perspective view of an electronic device casing that shows an opening on the case front.

Referring to FIG. 5, FIG. 6, and FIG. 7, there is shown a specific engagement mechanism 215, 216, 217 to which the current principles are applied. A protruding surface 216 extends inwardly from the interior surface of one of the vertical walls of one of the pieces. The protruding surface 216 includes a further protrusion 215 that engages a protrusion receiving opening 217 on the case top front piece 211. The protrusion receiving openings 217 are generally horizontal surfaces that have upstanding peripheral walls to make a slot that can receive the protrusions 215. The slots can be oversized in the dimension that is perpendicular to the interior surfaces of the vertical walls from which the horizontal ledge extends, or the slots can be oversized along its long lateral axis. The slot can be narrow along the dimension parallel to the vertical walls or along the horizontal surface's short lateral axis to snuggly fix the protrusions 215. The protruding surface 216, the further protrusions 215, and the protrusion receiving openings 217 form a screwless engagement structure 977.

The arrangement of the protruding surfaces 216 and the further protrusions 215 can be spaced from the interior top surface of the case top 210 to permit the antenna bracket 601 and the antennas 602 to be positioned at a lateral level between the interior top surface of the case top 210 and the protruding surfaces 216 and the further protrusions 215. This permits the antenna bracket 601 and the antennas 602 from interfering with the locking and/or unlocking the pieces of the electronic device.

Figure 8:
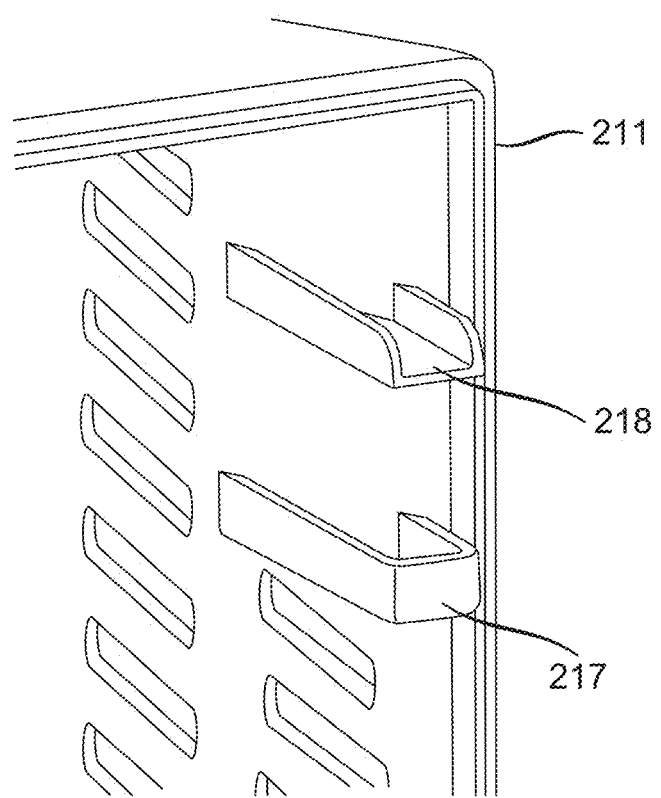
FIG. 8 is a perspective view of the retaining elements of the vertically oriented electronic device of FIG. 1, according to an implementation of the present principles.
Figure 9:
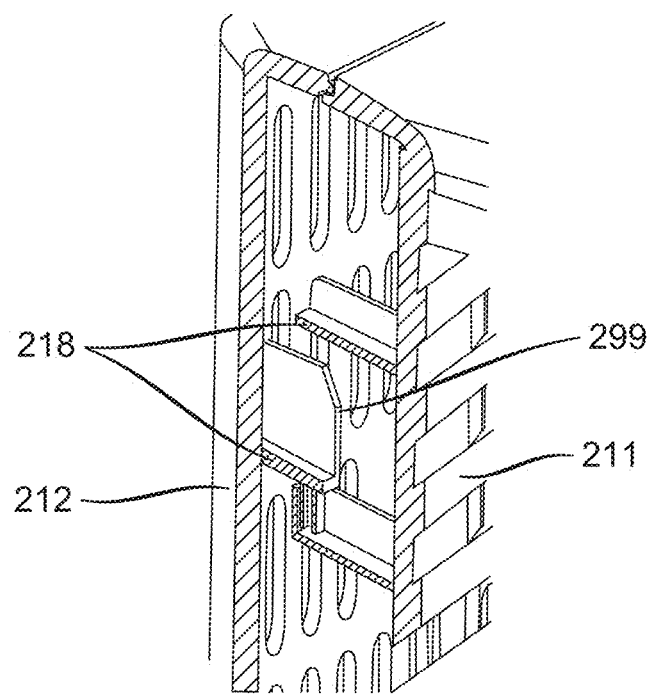
FIG. 9 is another perspective view of the retaining elements of the vertically oriented electronic device of FIG. 1, according to an implementation of the present principles.

FIG. 8 and FIG. 9 show further perspective views of the retaining elements that are used to engage the case top front piece 211 with the case top back piece 212. FIG. 8 shows ribs 218 that are positioned above the protrusion receiving openings 217 and also extend inwardly from the interior surface of one of the vertical walls of the front piece 211. The ribs 218 would interfere with the case rear retention element if an assembly start position is attempted that is too low. FIG. 9 shows that a chamfer 299 guides the case top 210 to an acceptable start location. Rib 218 prevents case front from starting in a position that is too low by preventing excessive case travel which can damage components.

Figure 10:
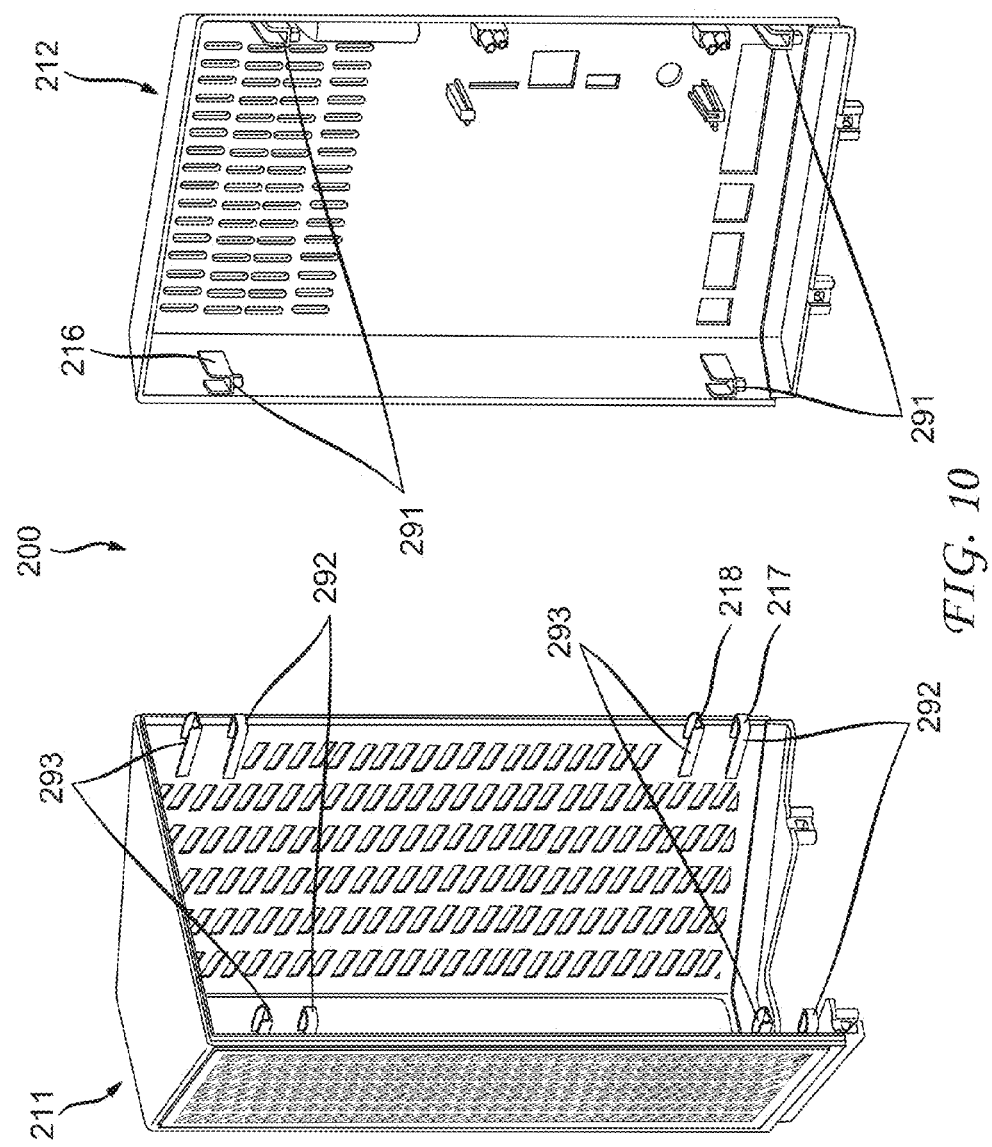
FIG. 10 is a disassembled perspective view of the vertically oriented electronic device of FIG. 1, according to an implementation of the present principles.

FIG. 10 is a disassembled perspective view of the vertically oriented electronic device 200 showing the interior of the case top front piece 211 and the case top back piece 212 to which the current principles are applied. The retention protrusions 291, the retention openings 292, and the over travel prevention portions 293 are shown.

Figure 11:
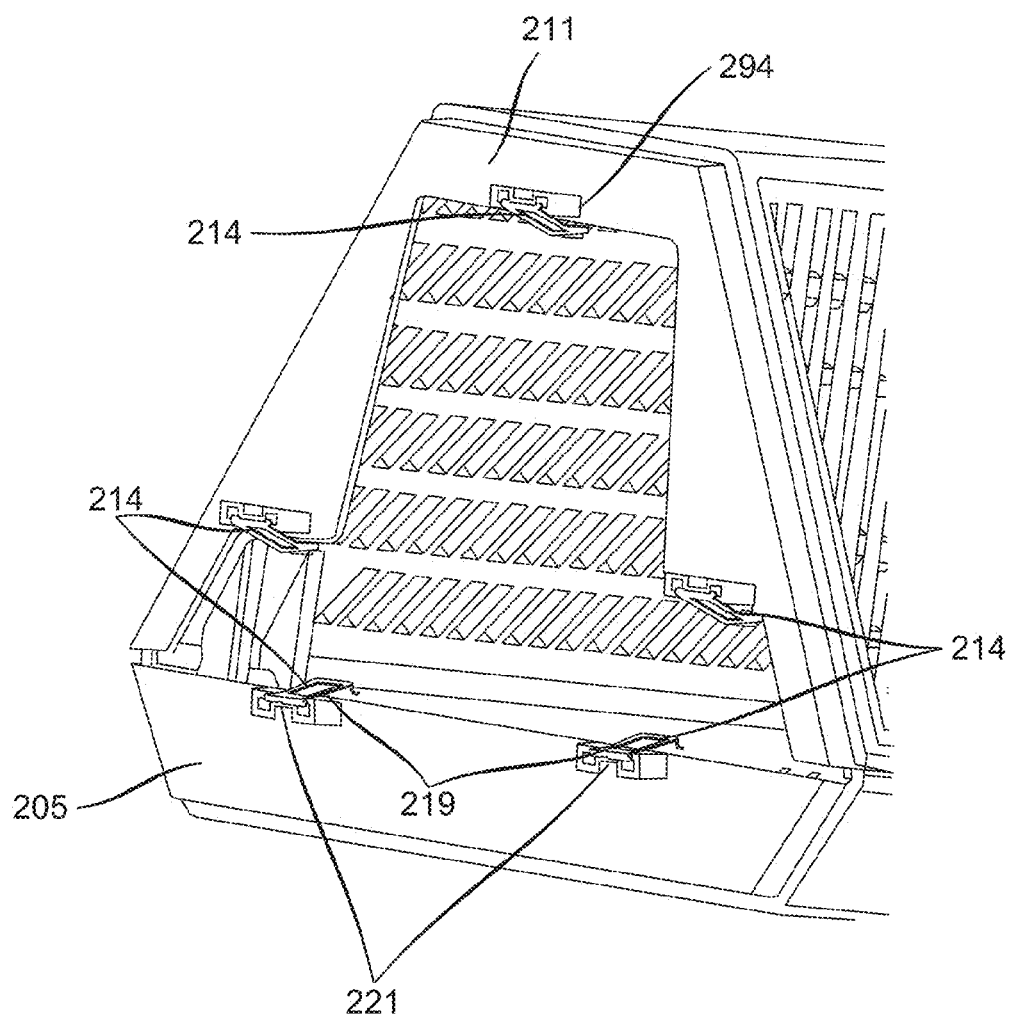
FIG. 11 is a bottom perspective view of the vertically oriented electronic device of FIG. 1 and the retention clips, according to an implementation of the present principles.

FIG. 11 shows a bottom perspective view of the vertically oriented electronic device 200 where the case bottom piece 213 is not attached revealing the retention clips 214.

Figure 12:
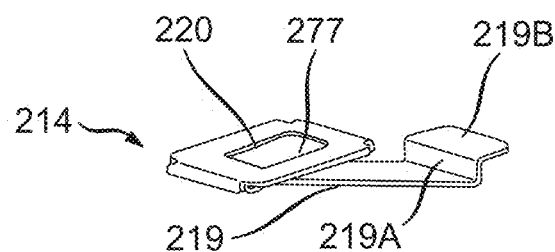
FIG. 12 shows an anchor portion of the retention clip according to one implementation of the present principles.
Figure 13:
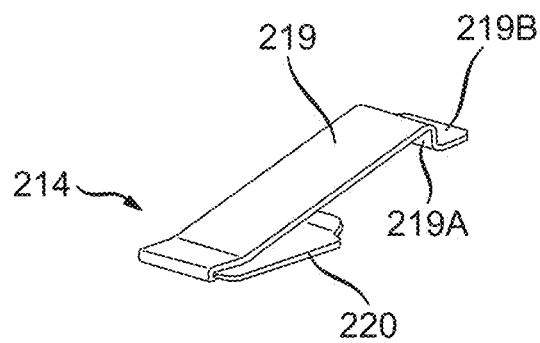
FIG. 13 shows a locking portion of the retention clip according to one implementation of the present principles.
Figure 14:
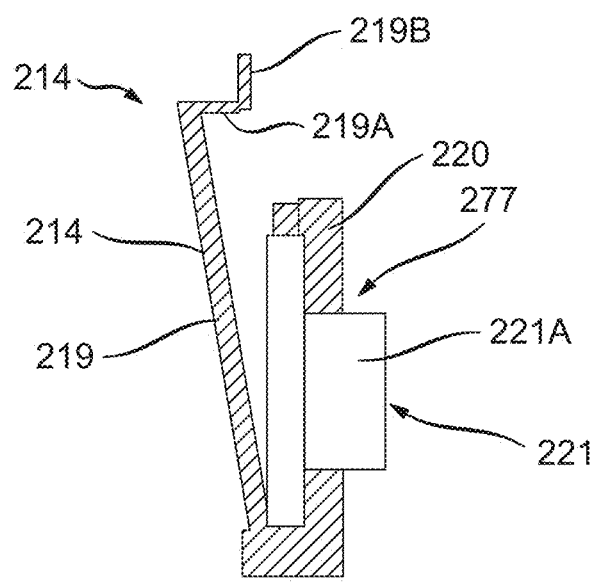
FIG. 14 shows a side view of the retention clip according to one implementation of the present principles.

FIG. 12, FIG. 13, and FIG. 14 are various views of the retention clip 214 to which the current principles are applicable. The retention clip 214 can be optionally composed of metal. The views show that the case top front piece 211 and the case top back piece 212 can be attached to one another and can then be attached to the case bottom piece 213 using the retention clips 214. The retention clips 214 are retained by elements on the case top front piece 211 and the case top back piece 212. The clip 214 is generally V-shape and includes an anchor portion 220 which is one side or leg of the V-shape. In accordance with one implementation, the anchor portion 220 has a rectangular planar shape and has an aperture 277 that fits into an anchor base 221 of the case top front piece 211 and the case top back piece 212. FIG. 14 shows how an aperture 277 of the anchor portion 220 engages a protrusion 221A in the anchor base 221 such that an inward pointing surface at the top of the anchor portion 220 grasps a top portion of the anchor base 221 and a bottom inner wedge grasps the bottom portion of the anchor base 221 to secure the retention clip 214 in place. This permits a locking portion 219 of the clip 214, which is the other side or leg of the V-shape, to engage with elements of the case bottom piece 213 to close or assemble the electronic device 200.

Figure 15:
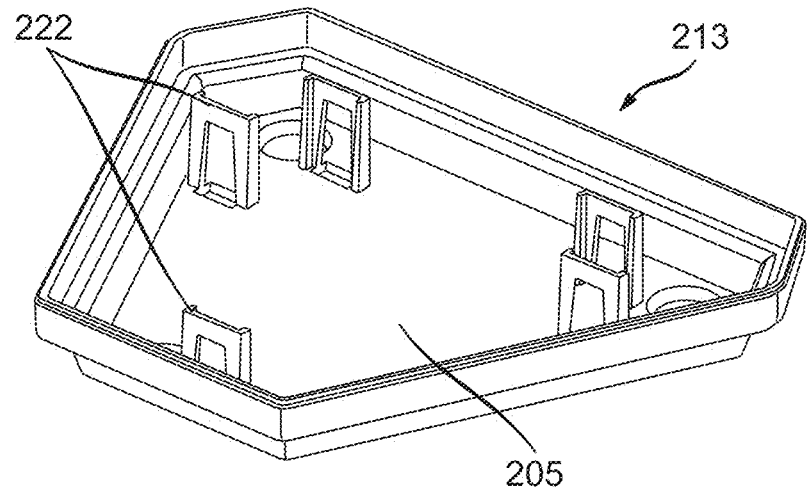
FIG. 15 is a perspective view of the bottom of the case of the electronic device of FIG. 1, according to an implementation of the present principles.
Figure 16:
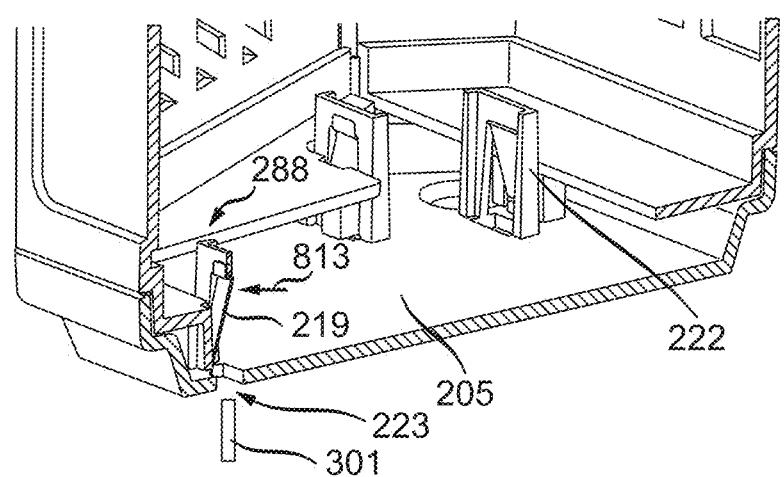
FIG. 16 is a perspective view showing how the bottom piece of the electronic device casing engages the case top front piece and the case top back piece.
Figure 17:
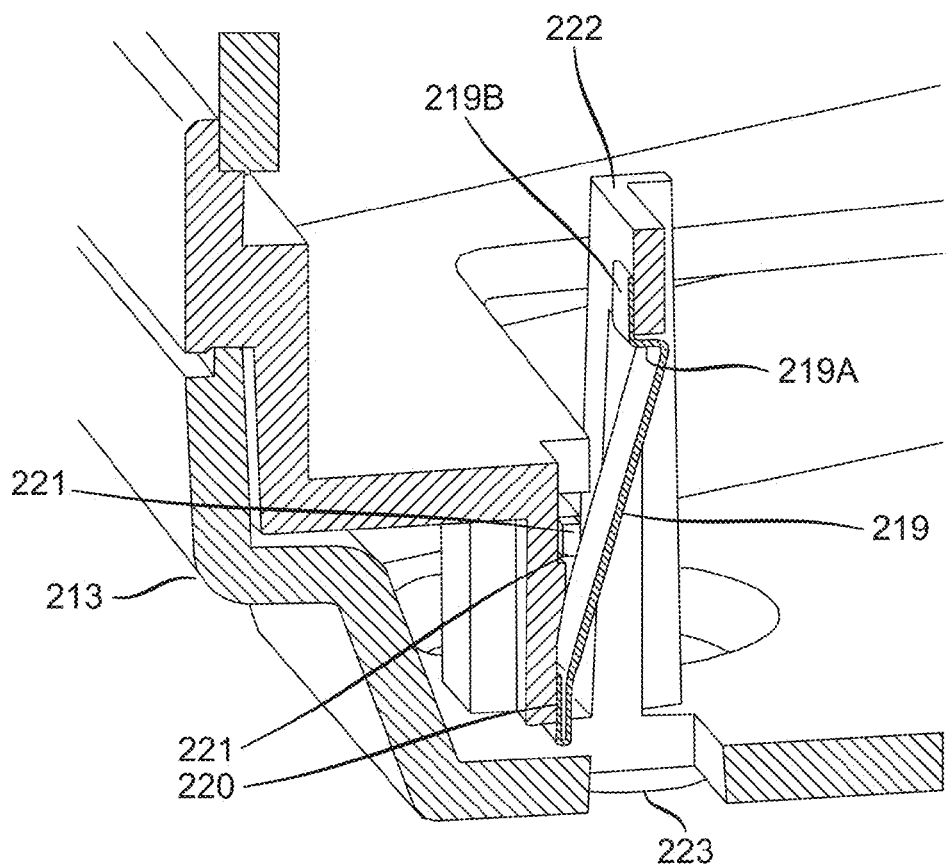
FIG. 17 is a more detailed perspective view showing how the bottom piece of the electronic device casing engages the case top front piece and the case top back piece.

In particular, referring to FIG. 15 and FIG. 16, the top of the locking portion 219 can have a horizontal surface 219A that extends inwardly to contact a bottom surface of a clip engaging element 222. The locking portion 219 can further have an upward extension 219B at the edge of the horizontal surface 219A to engage an edge of the bottom surface of the clip engaging element 222. As shown in FIG. 17, the outward spring force of the clip 214 causes the locking portion to move outward to engage the element 222. Those of skill in the art will appreciate that although a V-shape is shown and described, a U-shape could be employed as well and both sides of the V or U-shape part can have different heights. The retention clip 214 and the engaging elements 222 can be part of a screwless locking mechanism positioned adjacent to the base 205 of the electronic device and can be remote from the antennas in the antenna bracket 601 which can be positioned adjacent to the top 210 of the electronic device.

FIG. 15 is a perspective view of the case bottom piece 213, which shows the base 205 and the clip engaging elements 222 that extend vertically upward from the bottom piece 213 to which the current principles are applied. The clip engaging elements 222 are designed to engage the locking portion 219 of the clips 214 on the case top front piece 211 and the case top back piece 212. A screwless clip and spring mechanism 288 is formed from the clips 214 and the clip engaging elements 222.

FIG. 16 and FIG. 17 are perspective views showing how the case bottom piece 213 engages the case top front piece 211 and the case top back piece 212 to which the current principles are applied. Release finger 301 pushes the locking portion 219 inward to disengage the locking portion 219 as it enters an aperture 223 in the bottom piece 205.

Figure 18:
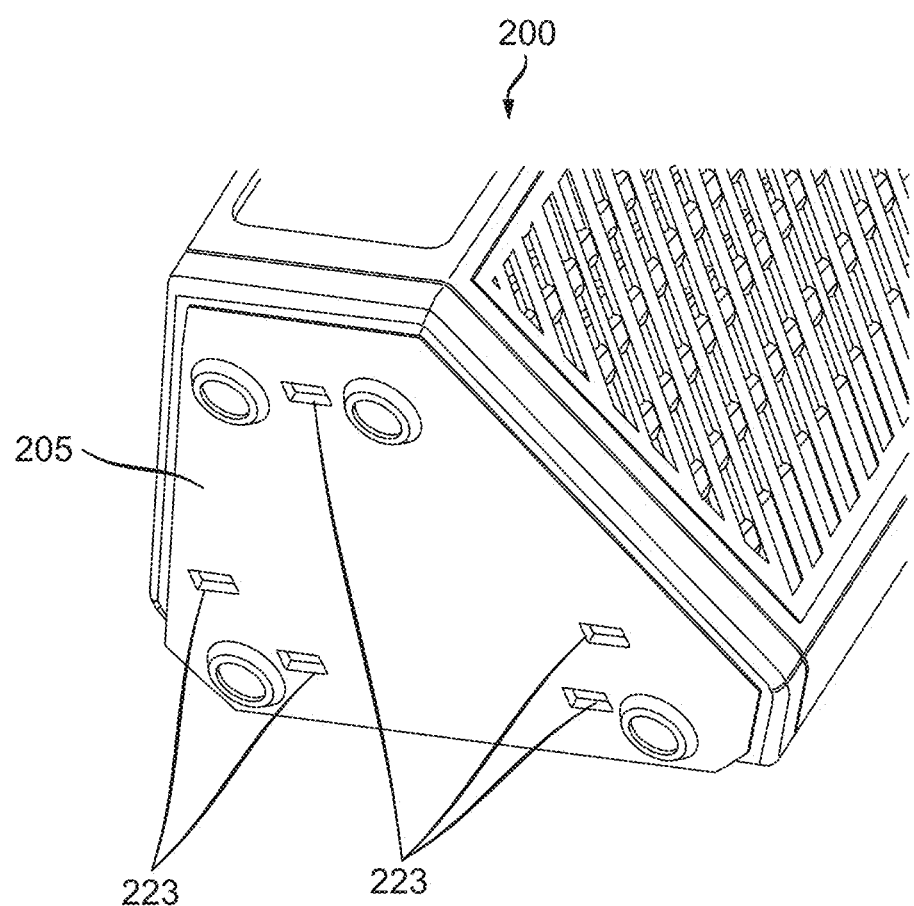
FIG. 18 is a bottom perspective view of the vertically oriented electronic device of FIG. 1.

FIG. 18 is a bottom perspective view of the vertically oriented electronic device 200 to which the current principles are applicable. As will be apparent from this figure, the apertures 223 for the unlocking the retention clips 214 are remote from the antenna bracket 601 and the antennas 602 located near the top of the vertically oriented electronic device.

Figure 19:
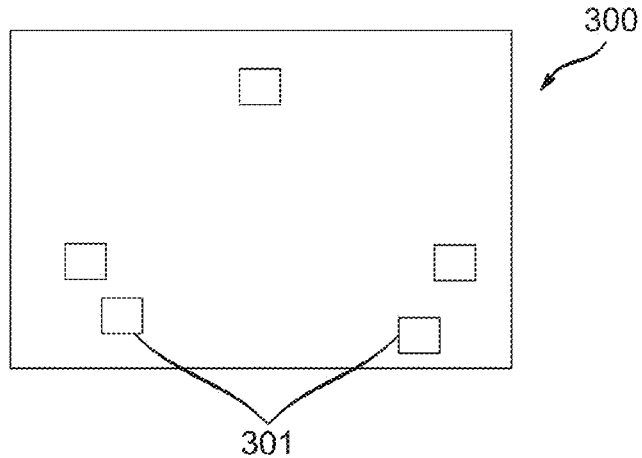
FIG. 19 is a plan view of a release fixture for use with the electronic device casing according to an implementation of the present principles.

FIG. 19 is a top view of a release fixture 300 to which the current principles are applied. FIGS. 16-19 show the release aperture 223 in base 205. One or more release fingers 301 are positioned on a base of a release fixture 300. When more than one release finger 301 is used, they will be arranged on the base of the fixture 300 in the same pattern as corresponding apertures 223 on the bottom of the device. The release fingers are permitted to enter the corresponding release aperture 223 to push the locking portion 219 inward toward the anchor portion 220, thereby removing the top portion (219A and 291B) of the locking portion 219 from the engaging element 222. This can be understood also with reference to FIG. 18 in which the release finger 301 (not shown in FIG. 18) will contact the outer edge of the locking portion 219 and move the locking portion 219 away from the engaging element 222.

Figure 20:
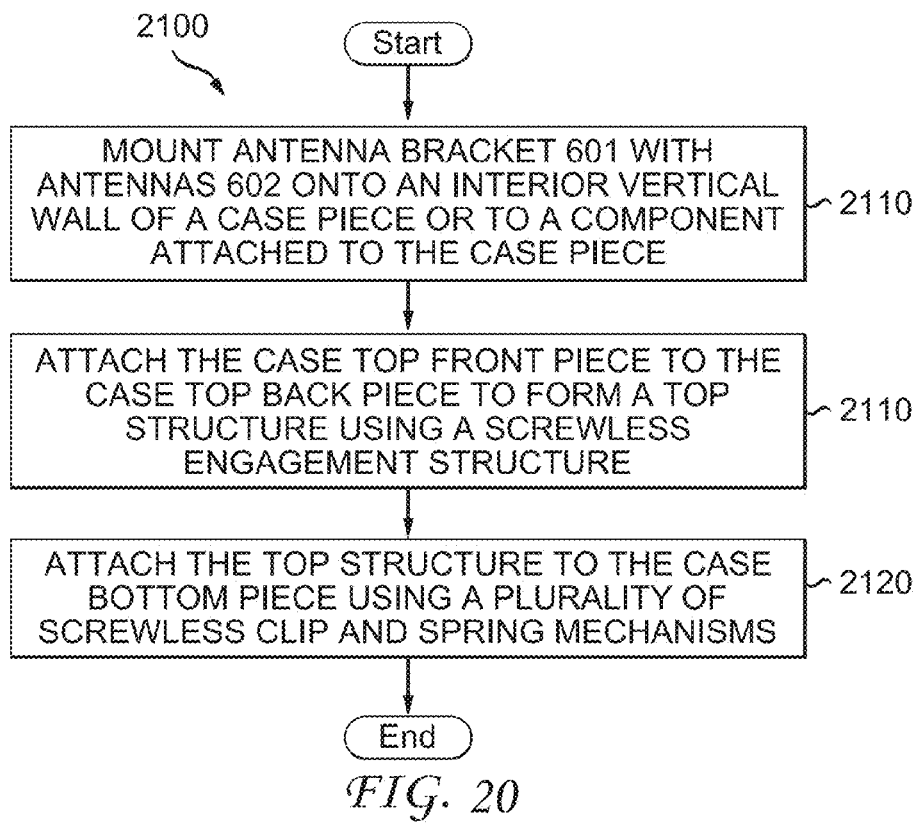
FIG. 20 is a flow diagram showing an exemplary method for assembling an electronic device having a case bottom piece, a case top front piece, and a case top back piece, commensurate with an embodiment of the present principles.

FIG. 20 is a flow diagram showing an exemplary method 2100 for assembling an electronic device having a case bottom piece, a case top front piece, a case top back piece, an antenna bracket and antennas mounted therein. Here, at step 2105, the antenna bracket 601 is mounted onto an interior vertical wall of the case top front piece or case top back piece or mounted to a component that is mounted to the interior vertical wall of the case top front piece or case top back piece. At step 2110, the case top front piece 211 is attached to the case top back piece 212 to form a top structure 210 using a screwless engagement structure 977 (See FIG. 2). At step 2120, the top structure 210 is attached to the case bottom piece 213 using a plurality of screwless clip and spring mechanisms 288. The case top back piece 212 includes printed circuit board staging slots 230 which are described in greater below.

The issue that arises with the antennas within the method above is that the antennas must be electronically connected to the antenna connectors on one or more printed circuits and it is often difficult to make the plurality of connections. This difficulty can arise with other connections to the one or more printed circuits. This can be because it is difficult to make certain connections when the circuit boards are already attached to casing walls, and also because it is difficult to hold the circuit boards still with one hand and make a plurality of connections with the other.

Figure 21:
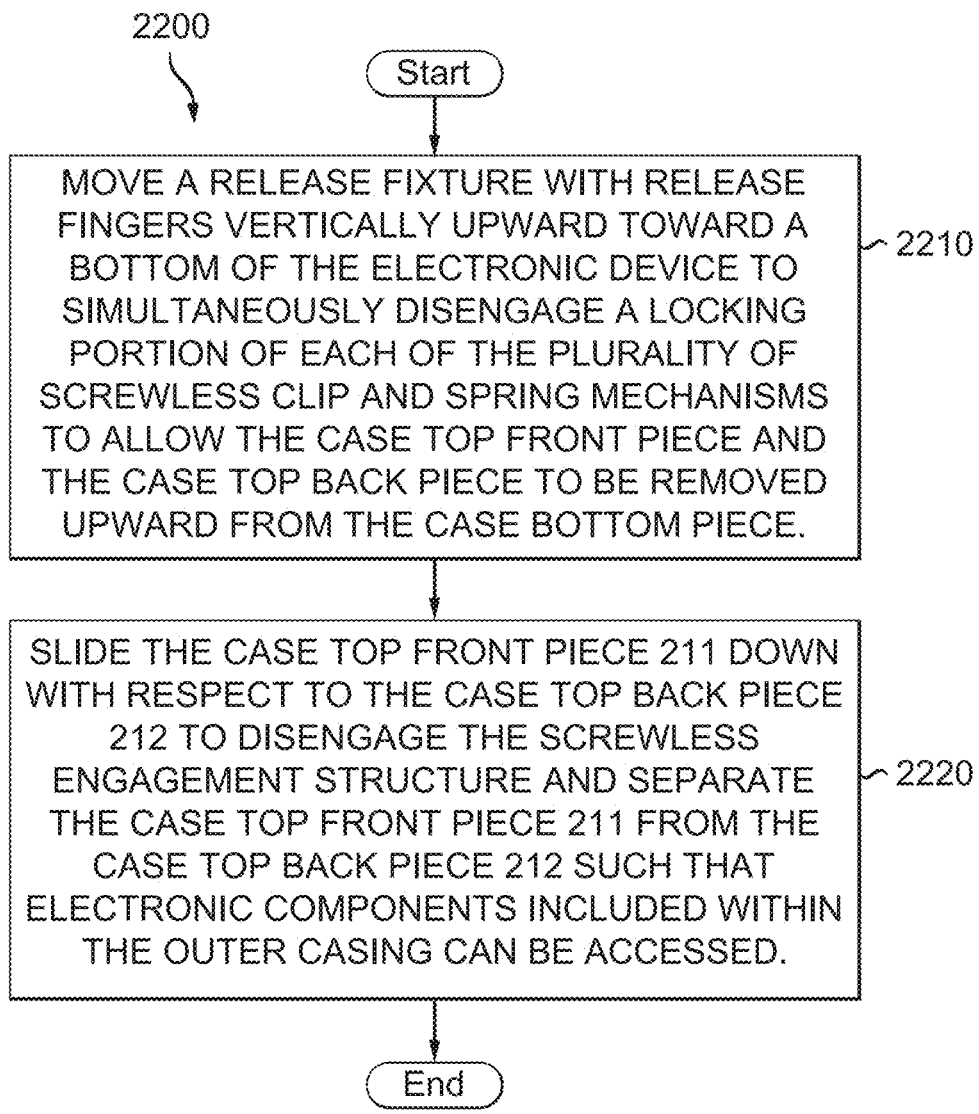
FIG. 21 is a flow diagram showing an exemplary method for disassembling an electronic device having a case bottom piece, a case top front piece, and a case top back piece, commensurate with an embodiment of the present principles.

FIG. 21 is a flow diagram showing an exemplary method 2200 for disassembling an electronic device having a case bottom piece, a case top front piece, and a case top back piece having the antenna bracket 601 mounted therein. The method 2200 is applied to an assembled condition, wherein the case top front piece is attached to the case top back piece 212 to form a top structure 210 using a screwless engagement structure, and the top structure is then attached to the case bottom piece using a plurality of screwless clip and spring mechanisms 288. At step 2210, a release fixture 300 is moved vertically upward to cause the release fingers 301 to also move vertically upward toward a bottom of the electronic device to simultaneously disengage a locking portion 219 of each of the plurality of screwless retention clips 214 and spring mechanisms 288, thereby allowing the case top front piece 211 and the case top back piece 212 to be removed upwardly from the case bottom piece 213. Those of skill in the art will appreciate that the release tool 300 can be positioned on a surface and the entire electronic device is lifted and placed down onto the releases tool to enable the fingers 301 to engage the respective apertures 223 and disengage the locking portions 219 of each of the retention clips 214. At step 2220, the case top front piece 211 slides down with respect to the case top back piece 212 to disengage the screwless engagement structure and separate the case top front piece 211 from the case top back piece 212 such that electronic components included within the electronic device can be accessed.

The electronic device 200 can be a set-top box or the like and can be vertically oriented such that the height of the device is higher than the width of the front vertical surface and/or the rear vertical surface and/or the lateral depth. The lateral cross section can be a quadrilateral shape in which the front and back are parallel and the side surfaces are not parallel to one another. The device can be designed such that the release fixture and release fingers move vertically upward toward the bottom of the device to simultaneously disengage the plurality of locking portions to allow the case top front piece 211 and the case top back piece 212 to be remove upward from the case bottom piece 213. The case top front piece 211 and the case top back piece 212 can then further be detached from one another by moving the case top in a motion oppose to that shown in FIG. 5 to attach the two pieces (case top front piece 211 and case top back piece 212). With the two pieces 211 and 212 attached, the assembly can be reassembled or assembled by aligning the clip engaging elements 222 with the clip 214 when the release fixture is removed or not present.

As noted above, the electronic device 200 can be a quadrilateral generally in which the front and back are parallel and the side surfaces are not parallel to one another. However, the general quadrilateral shape can include some additional vertical connecting surfaces to make at least two additional minor surfaces (i.e. substantially smaller vertical surfaces) 280 between the rear wall 206 and side walls 204 (as shown in FIG. 4).

Further disclosed is a method of making a printed circuit board to printed circuit board electrical connection or configuration 500 when a second printed circuit board 502 is positioned at a right angle to the primary printed circuit board 501. This can include the second PCB being connected behind the primary PCB on the component side 504 and the second printed circuit board being positioned on a non-component or bottom side 505 of the primary PCB. The connection for the two PCBs is through connector 503.

FIG. 22, FIG. 23, FIG. 24, and FIG. 25 show perspective views of circuit board assembly configuration 500 which can be employed in the vertically oriented electronic device 200 to which the current principles are applied. These views show wire securing slots 540 on the primary printed circuit board 501 along its upper edge. These slots 540 can be associated with connectors 606 which can be antenna connectors for antenna wires 604. The small plan view cross-section area of the configuration 500 from a bottom perspective makes the configuration 500 commensurate with the screwless casing design of the vertically oriented electronic device 200. The reason is the plan view cross-section can effectively be a T-shape that can be positioned by design to avoid the screwless locking mechanism or vice-versa. Further, by having the antenna bracket 601 mounted in the finished product at heights in the device in which most of the antenna bracket 601 is above the top edge of the vertically oriented primary printed circuit board 501, makes the arrangement of the internal components further commensurate with the screwless casing design. With such an arrangement, the locking elements of the housing and the associated release fixture and release fingers for disassembly can be more freely positioned to avoid contacting or interfering with the printed circuit boards and/or other components. If one of the circuit boards were to be horizontally positioned, there would be less positions and greater constraints on the positioning of the locking elements of the housing and associated release fixture and release fingers. The circuit boards would need to be smaller and/or need to be positioned at higher locations with the device.

Figure 23:
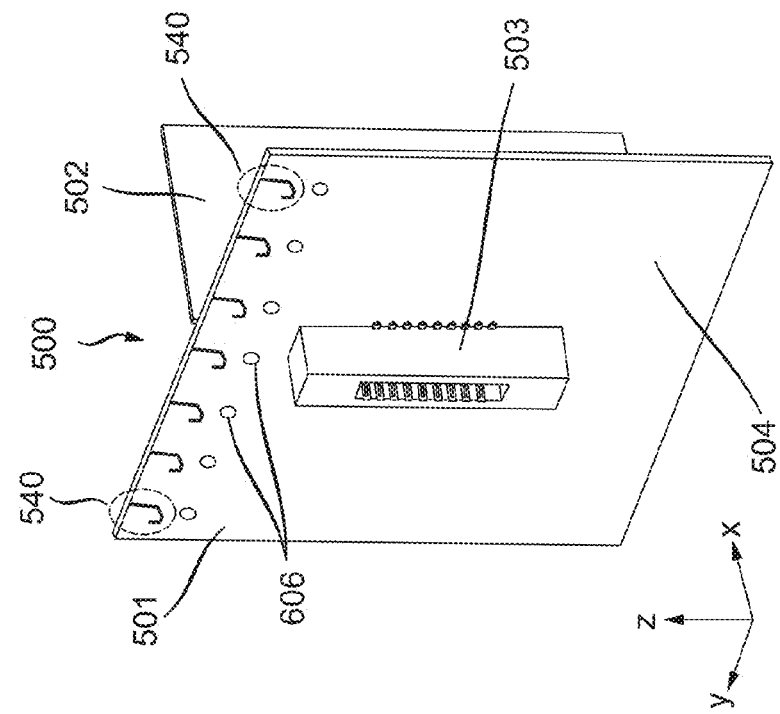
FIG. 23 shows an opposite side perspective view of a circuit board assembly configuration having wire securing slots on one of the printed circuit boards and to which the current principles are applied.

Since a component side 504 of PCB 501 can face a rear wall 206 of the housing of the electronic device, a problem is that access to the components on the component side 504 and access to a secondary PCB 502 may need to be made through an undesirable cable. Cables add cost and a point of potential failure. However, the connector 503 in FIG. 23 provides a way for the secondary PCB 502 to be directly attached to the primary PCB 501 in which the secondary PCB 502 is inserted into the connector 503. This arrangement reduces cost, improves quality and makes assembly easier, with fewer possibilities for assembly error.

Figure 22:
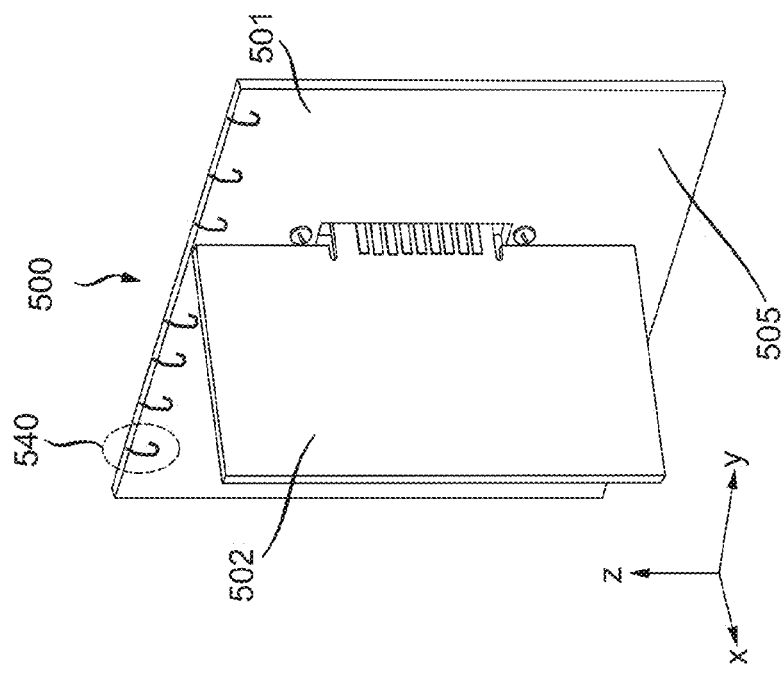
FIG. 22 shows a perspective view of a circuit board assembly configuration having wire securing slots on one of the printed circuit boards and to which the current principles are applied.
Figure 24:
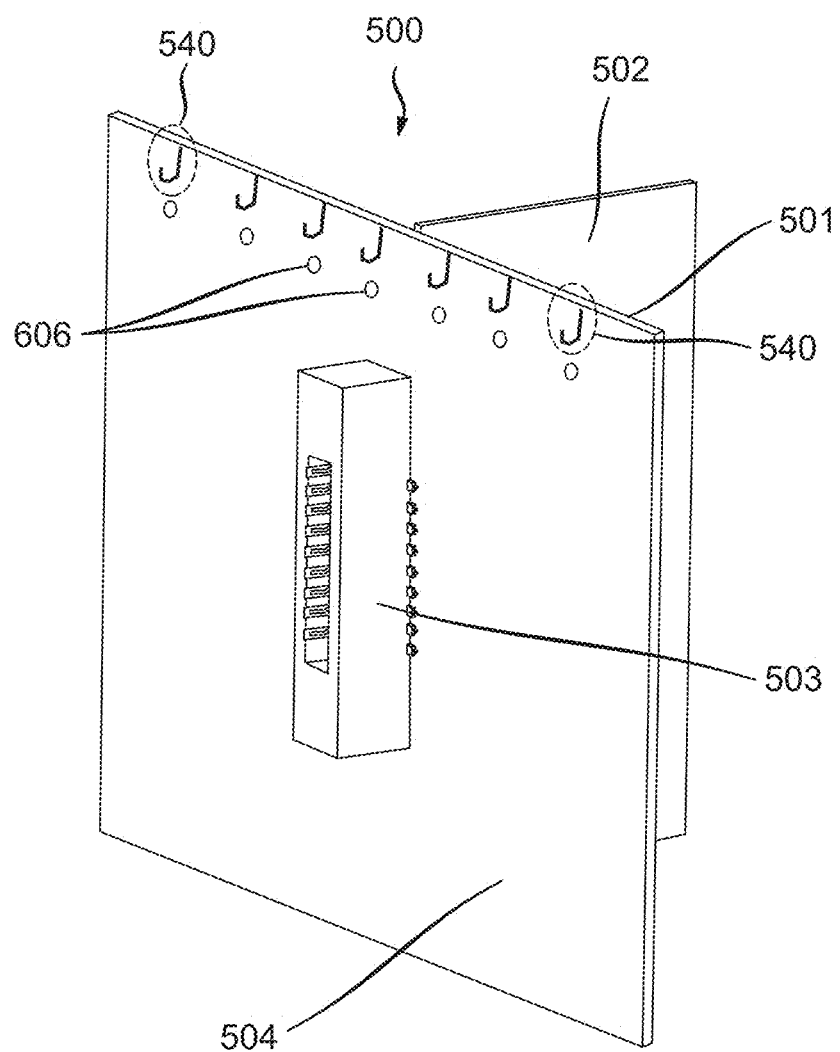
FIG. 24 shows antenna connection positions near the top of a component side of a printed circuit board.

Because the PCB arrangement shown in FIGS. 22 and 23 reduces the number of cables, it makes room for the use of the plurality antenna cables or wires 604 needed to transmit antenna electrical signal within the device. As observed in FIG. 24, if the antenna connectors 606 are positioned near the top edge of the first printed circuit board 501, it is possible to have the antenna connectors 606 on the component side 504. As such, the antenna wires 604 can be short and the overall number of cables/wires within the device itself can be kept to a minimum number.

Also, having the connector 503 being elongated to run along the major axis adds stability to the support of second PCB 502. Such a configuration of the connector 503 being positioned in a central portion of the primary board 501 allows the second board 502 to fit more conveniently in the casing, in which case top front piece 211 has a tapered shape in which the casing narrows to the front wall 208.

Figure 25:
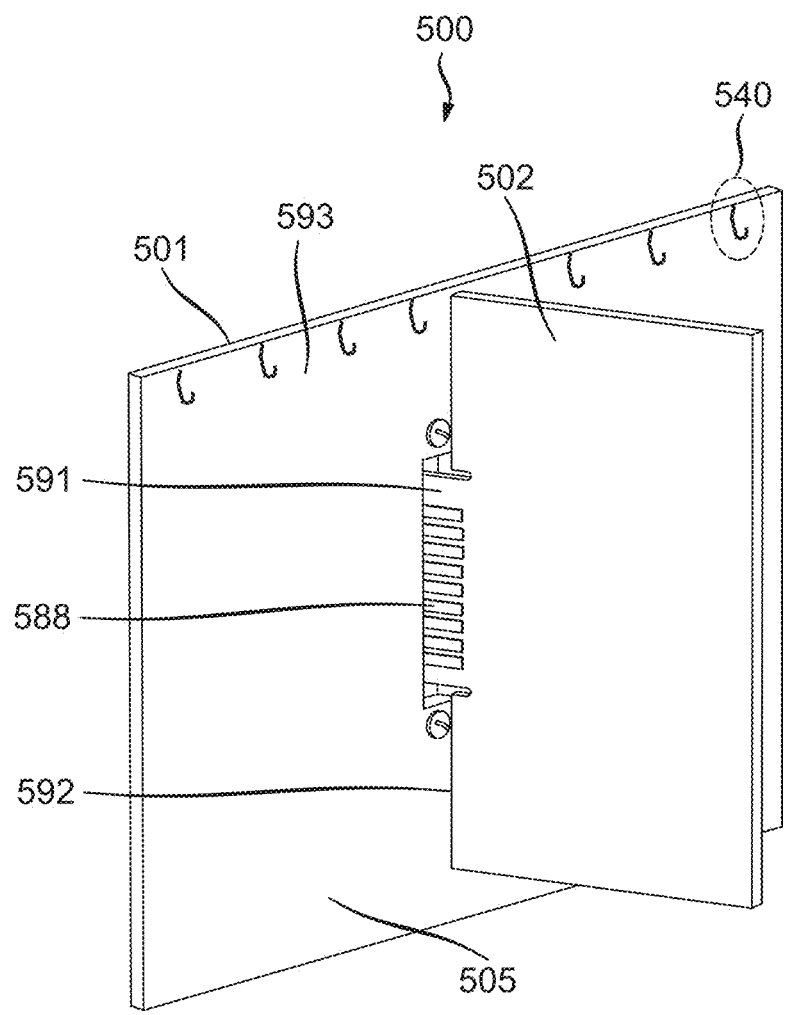
FIG. 25 shows a second printed circuit board which abuts a surface when connected.

As shown in FIG. 25, in an embodiment, a portion of the second printed circuit board 502 includes an extension 591 of the second printed circuit board from a plane 592 that substantially abuts a surface of the second printed circuit board when the first printed circuit board 501 is connected to the second printed circuit board by the connector 503. Contacts 588 are arranged on the extension 591.

Figure 26:
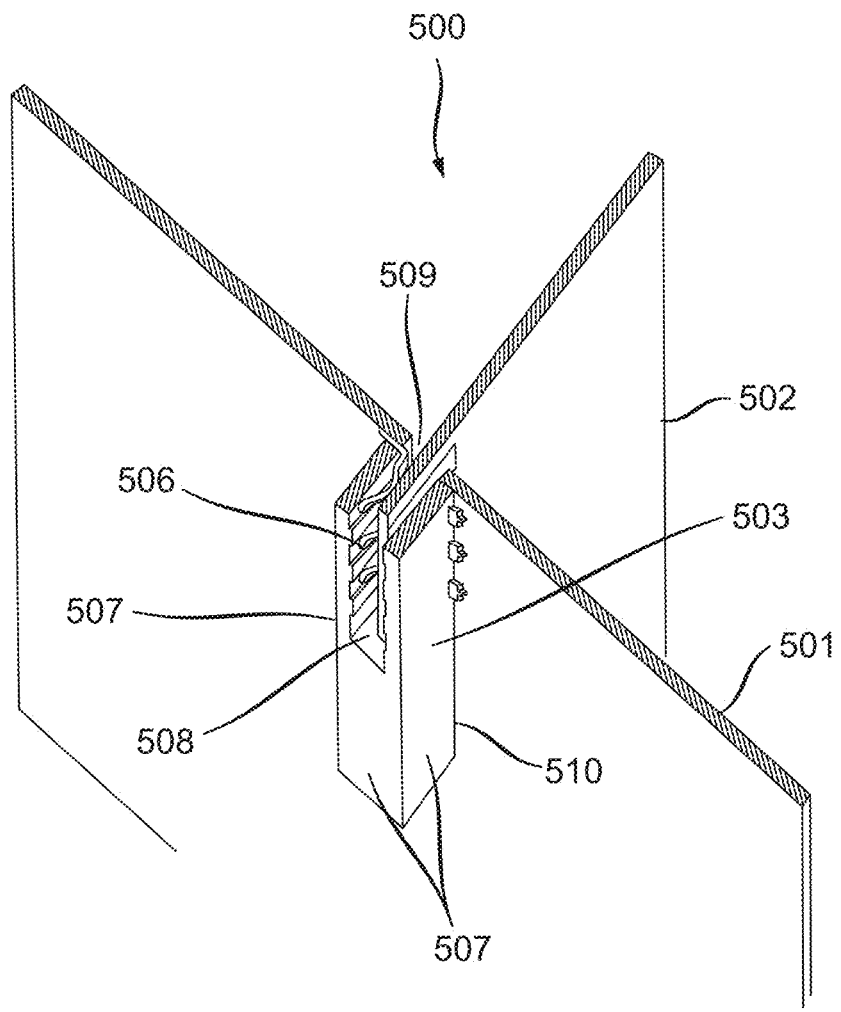
FIG. 26 is a perspective view of a circuit board assembly configuration highlighting a connector to which the current principles are applied.

FIG. 26 is a cross sectional perspective view of a circuit board assembly configuration 500 highlighting the connector 503 and showing the contacts 506 that are on the interior cavity 508 of the connector 503 to which the current principles are applied. The connector 503 can be a rectangular structure having peripheral walls 507. The rectangular structure can have a leading edge 510 that can be a surface that faces the component side 504 of the PCB 501 and contacts the PCB 501 and a portion of the connector 503 that protrudes through aperture 509 in the first PCB 501. The connector 503 can extend back to the panel jack at the panel jack opening or can be connected to a cable running to the panel jack. The panel jack can be on the rear wall 206 of the electronic device or can be a part of the rear wall. The rear wall 206 can be part of the case top back piece 212 in which some of the lower rectangular features on the piece 212 in FIG. 11 can represent a panel jack.

Figure 27:
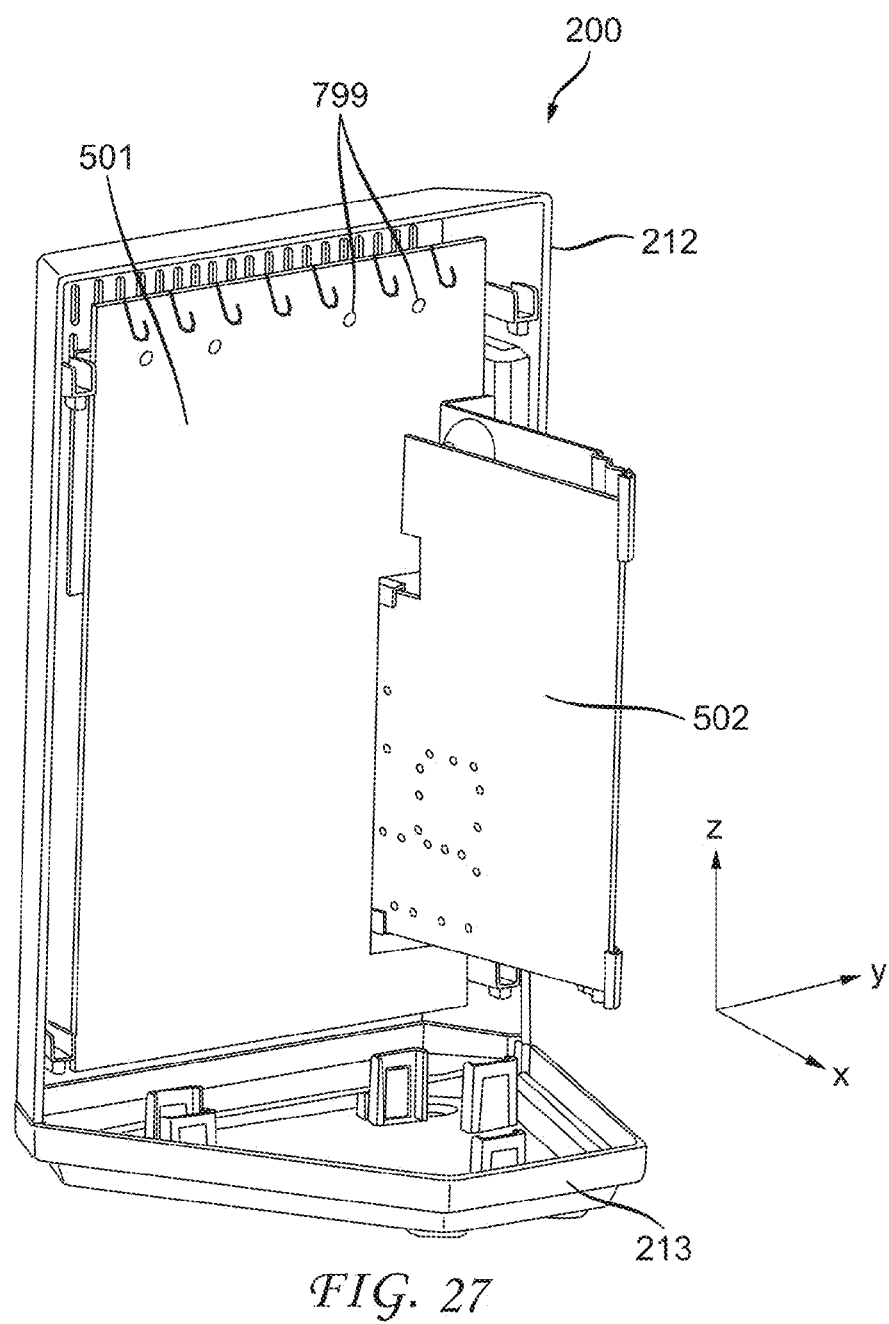
FIG. 27 is an interior perspective view of the vertically oriented electronic device of FIG. 1 showing the circuit board assembly configuration to which the current principles are applied.
Figure 28:
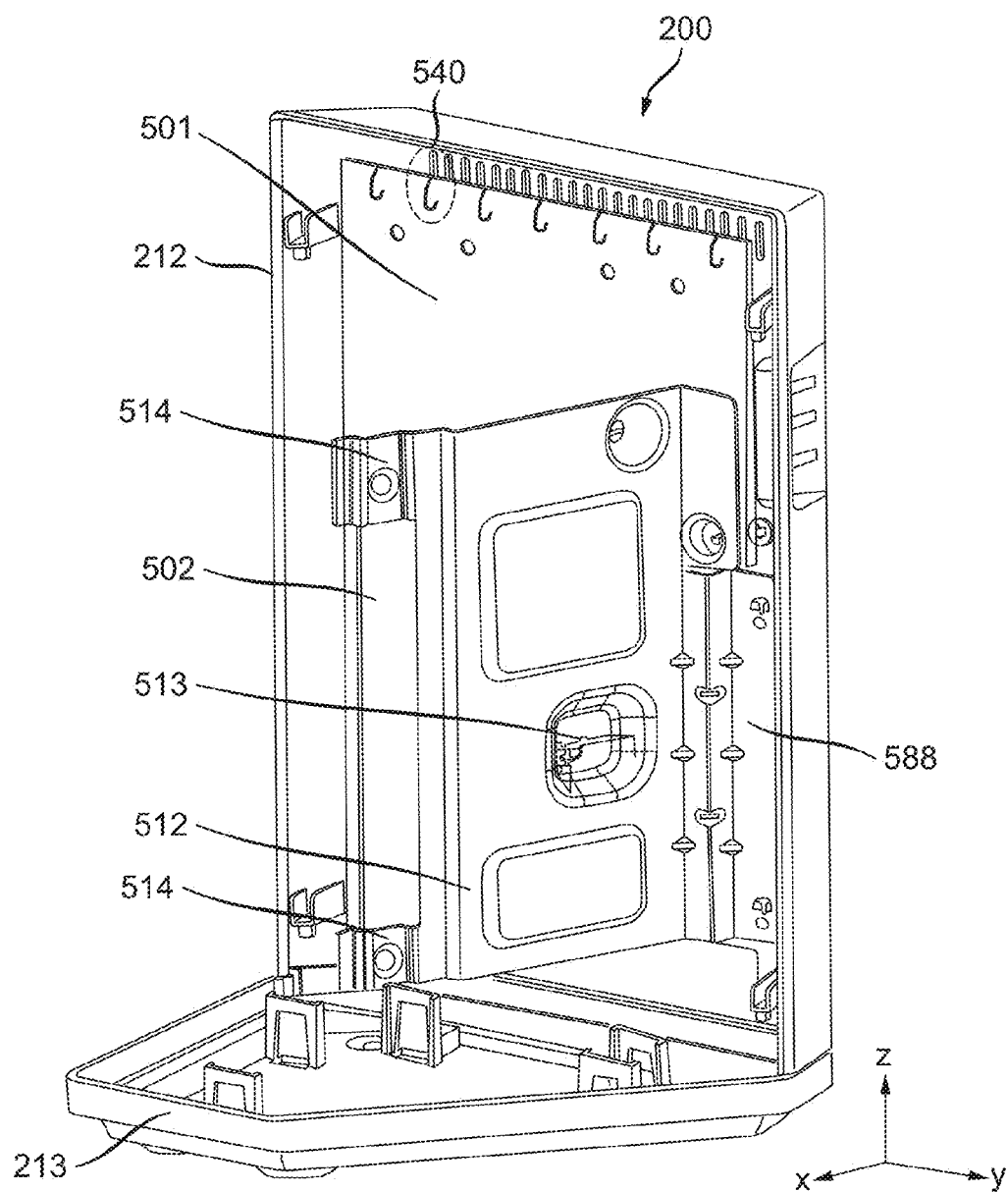
FIG. 28 is an interior perspective view of the vertically oriented electronic device of FIG. 1 showing a secondary printed circuit board having a heat spreader or heat sink on one side.

FIG. 27, and FIG. 28 show interior perspective views of the vertically oriented electronic device 200 illustrating the circuit board assembly configuration 500 to which the current principles are applied. These views show that the primary PCB 501 can be screwed, bolted, or secured to the rear case or the case top back piece 212.

The view in FIG. 28 further illustrates that the secondary PCB 502 can have a heat spreader or heat sink 512 on one of its sides. The heat spreader or heat sink 512 can have a central contact portion 513 that thermally contacts the PCB 502 or heat generating components thereon. The spreader or sink 512 can have a planar peripheral portion that permits heat to be radiated or convected away from the PCB 502.

In an embodiment, the heat spreader or heat sink 512 can be generally parallel to the PCB 502 and both heat spreader or heat sink 512 and PCB 502 can be perpendicular to the PCB 501. The heat spreader or heat sink 512 can further provide structural support for the second PCB 502. Here, the heat spreader or heat sink 512 can have a base edge with a vertical surface 588 that connects to the first PCB 501 or the case back 212 to support by the heat spreader 512 and in turn the heat spreader 512 support the second PCB 502 through contact points 514 (which can be screws or bolts or the like). The contact points 514 can work in conjunction with connector 503 to support the PCB 502. The contact points can run along an edge of the PCB 502 opposite the edge of PCB 502 having the base edge (support edge). Other mechanical connection features 799, such as screws or bolts, can secure the main board 501 to the electronic device 200.

Figure 29:
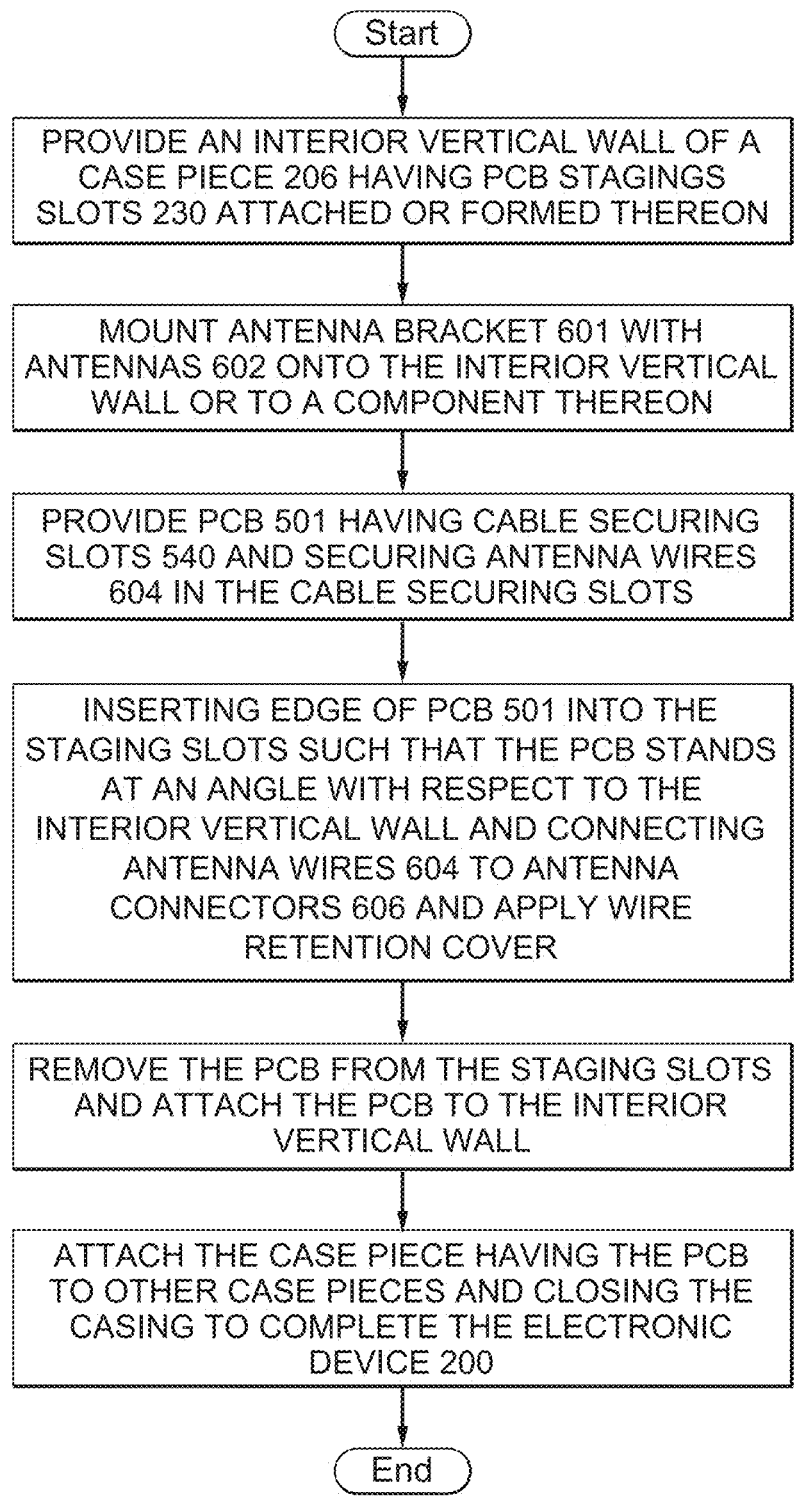
FIG. 29 is a flow diagram showing an exemplary method for assembling an electronic device having a case bottom piece, a case top front piece, and a case top back piece having printed circuit board staging slots, and a printed circuit board having wire securing slots, according to an implementation of the present principles.

FIG. 29 shows an exemplary method 4800 for assembling an electronic device having a case bottom piece, a case top front piece, and a case top back piece having printed circuit board (PCB) staging slots 230. At step 4801, one can provide an interior vertical wall of a case piece 206 having PCB staging slots 230 attached or formed thereon. These staging slots 230 will be discussed in more detail below and are shown in FIGS. 31, 33, 36, 38, and 39. At step 4802, the antenna bracket 601 with antennas 602 can be mounted onto the interior vertical wall or to a component thereon. It should be understood that alternatively the antennas 602 can be added to the bracket 601 after the mounting of the bracket. At step 4803, the PCB 501 is provided having wire securing slots 540 and the antenna wires 604 can then be inserted into the wire securing slots 540. The wire securing slots 540 can be L-shaped to support one wire or a T-shaped (i.e. made by an L-shape and it mirror image combined) to support two wires in which the T-shape is inverted compared the L-shape and one wire goes to the left side and one wire goes to the right side of the line segment of the T-shape that is parallel to the edge of the printed circuit board. The L-shape and T-shape cutouts are shown in FIG. 31D which is a magnified view of the identified portion of FIG. 31C in the wire securing slots region 541. At step 4804, an edge of the printed circuit board 501 is inserted into the staging slots 230 such that the printed circuit board (PCB) stands at an angle with respect to the interior vertical wall, and the antenna wires 604 can be connected to antenna connectors 606 on the printed circuit board. This is an intermediate process step and shown in FIG. 38. These steps 4802 and 4803 can also be used or can alternatively be used to make other connections to the printed circuit board or printed circuit boards. At step 4805, the printed circuit board is removed from the staging slots and is attached to the interior vertical wall and the wire retention cover is applied to the printed circuit board edge over the wires. See views in FIGS. 42-46 to see how the cover is configured and fits along the top edge of the circuit board. At step 4806, the case piece having the printed circuit board is attached to other case pieces and the casing is closed to complete the assembly of the electronic device 200.

This method 4800 can include one or multiple printed circuit boards in an electronic device 200. The mounting of the bracket can include the use of screws, bolts or the like. The method can include connecting the second printed circuit board 502 to the first printed circuit board 501 in a perpendicular configuration 500 by the connector 503 on the first printed circuit board 501, by passing a portion of the second printed circuit board 502 through a second side of the first printed circuit board 501 to engage the connector 503 on the first side of the first printed circuit board 501. The method can also include providing a structural support for a heat spreader or heat sink 512 having at least a portion thereof thermally contacting the second printed circuit board 502 or one or more heat generating components on the second printed circuit board 502, by connecting a vertical ledge of the heat spreader or heat sink 512 to the first printed circuit board 501 or to the case top back piece 212.

Although the staging slots have been beneficial, an embodiment of the current principles includes features as described in FIG. 29, but with no staging slots for the supporting the printed circuit board while the antenna wires are inserted in the wire securing slots. Instead the circuit board with the wire securing slots can be appropriately staged by something other than the staging slots such that the wires can be inserted in the wire securing slots.

Figure 30:
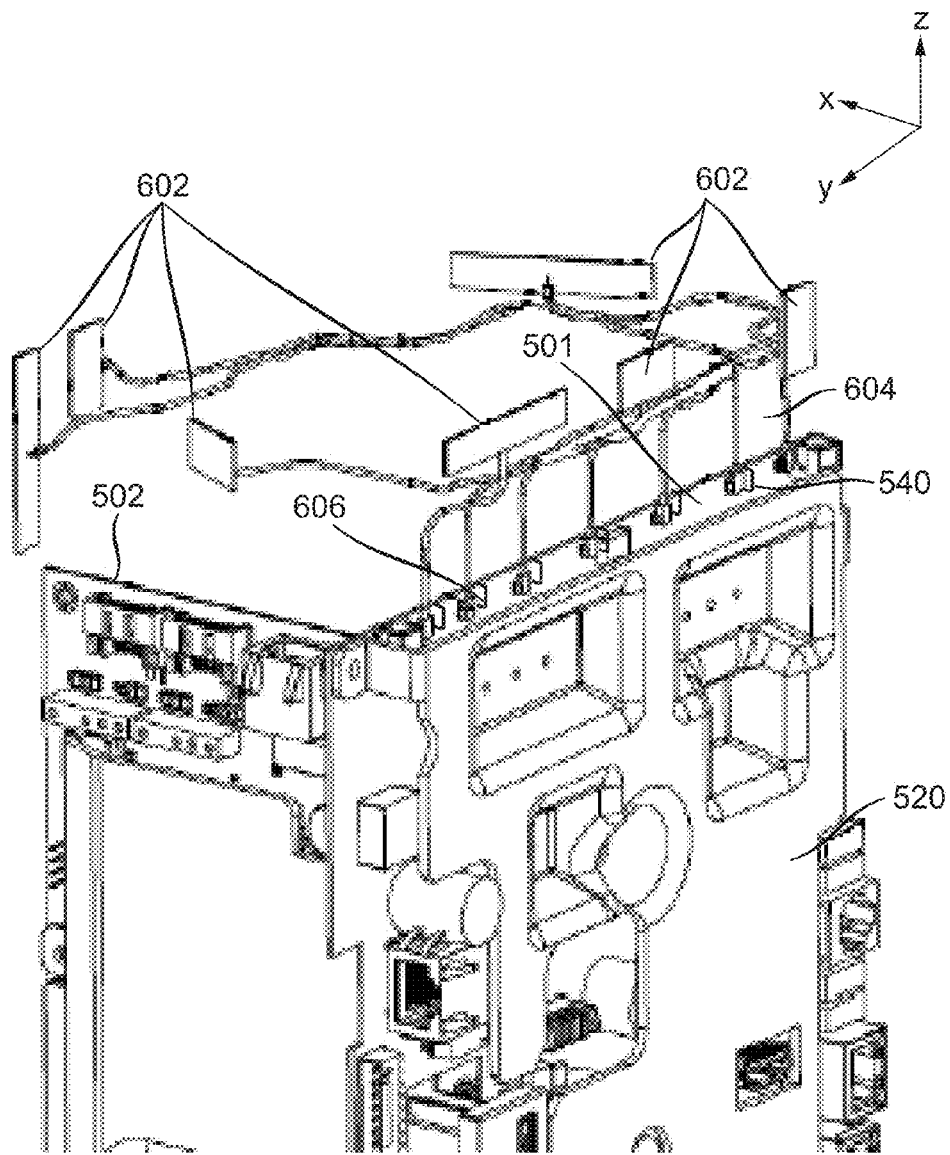
FIG. 30 shows a rear perspective view of a set top box without the casing, in which a plurality of antennas are distributed over the circuit boards, according to an implementation of the present principles.

FIG. 30 shows the feature of the set top box without the case in which a plurality of antennas 602 are distributed over the printed circuit boards 501 and 502 and outside the peripheries of one or both of the orthogonally arranged printed circuit boards 501 and 502. An embodiment can include only one board and less than 7 antennas. Here, the first printed circuit board 501 with a board heat spreader and heat sink 520 (in which "board" refers to the heat sink or spreader being associated with the circuit board) is attached to one side of the first printed circuit board 501 that is opposite the side that connects to the second printed circuit board 502. The board heat spreader and heat sink 520 is between the first printed circuit board 501 and the rear wall 206 of the case top back piece 212 of the casing of the electronic device. The antennas 602 are connected to one of the circuit boards and, in this embodiment, are all attached to the first printed circuit board 501. The antennas 602 can be connected to the antenna connector 606 on the first printed circuit board 501 by way of the antenna wires 604. The antennas can be WIFI antennas and can be vertically oriented in the vertically oriented set top box as shown and positioned adjacent to the top 210 between the outer top peripheral edges of the printed circuit boards and the top 210 of the set top box. The antennas positioned along the rear wall 206 can be parallel to the rear wall 206 and laterally positioned to be between a vertical plane extending from the plane of the first printed circuit board 501 and the rear wall 206. The antennas 602 can be laminated antenna printed circuit boards.

Figure 31A:
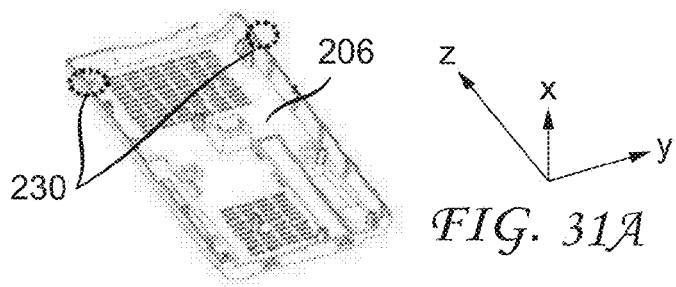
FIG. 31A shows a perspective interior view of the rear wall of the case top of the electronic device with different components thereon, according to an implementation of the present principles.
Figure 31B:
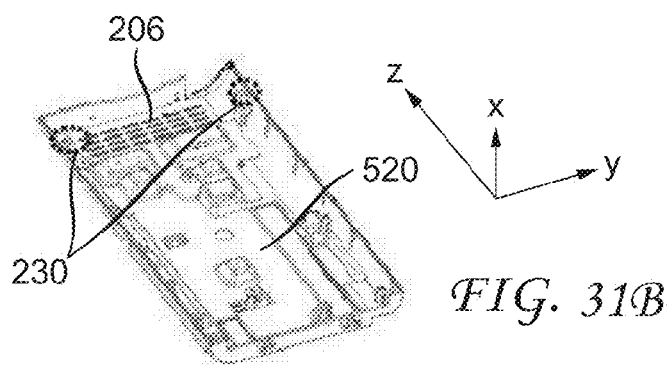
FIG. 31B shows a perspective interior view of the heat spreader adjacent to the rear wall of the electronic device.
Figure 31C:
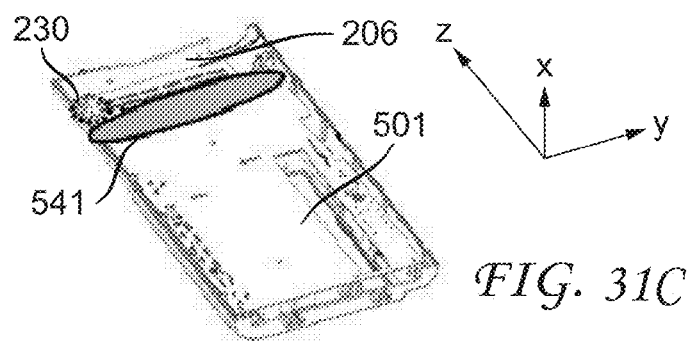
FIG. 31C shows a perspective interior view of a printed circuit board connected to the heat spreader.
Figure 31D:
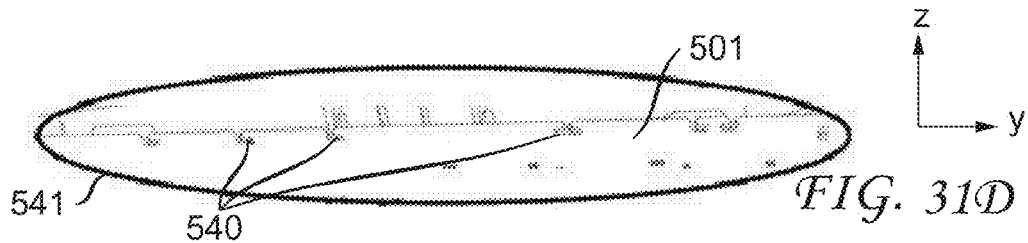
FIG. 31D shows L-shape and T-shape cutouts of a printed circuit board region of FIG. 31C.

FIG. 31A shows the rear wall 206 of the case top back piece 212 that is omitted in FIG. 30. FIG. 31B shows the board heat spreader and/or heat sink 520 positioned adjacent to the rear wall, and FIG. 31C shows the first printed circuit board 501 which is connected to the board heat spreader and/or heat sink 520 thereover. These figures also show the staging slots 230 positioned on the interior wall of the rear wall 206.

Inspection of FIG. 30 shows that interior volume of vertically oriented electronic devices can be quite crowded with a complex arrangement of components that comprise circuit boards, the components on the circuit boards, and the components to which the circuit board components are physically or electronically connected. This crowdedness and complexity is further enhanced when a plurality of antennas is needed, due to the fact that conventional arrangement of the antennas involves having their own independent support. This, in turn, adds to the number of interior components that must be individually staged, isolated from other components and installed. Furthermore, in these vertically oriented electronic devices, it turns out that there are spatial constraints and inefficiencies with the individual supports. In other words, the need for rapid assembly in high volume factories makes it difficult to manufacture such devices in which the antennas are individually supported with their own supports.

Figure 32:
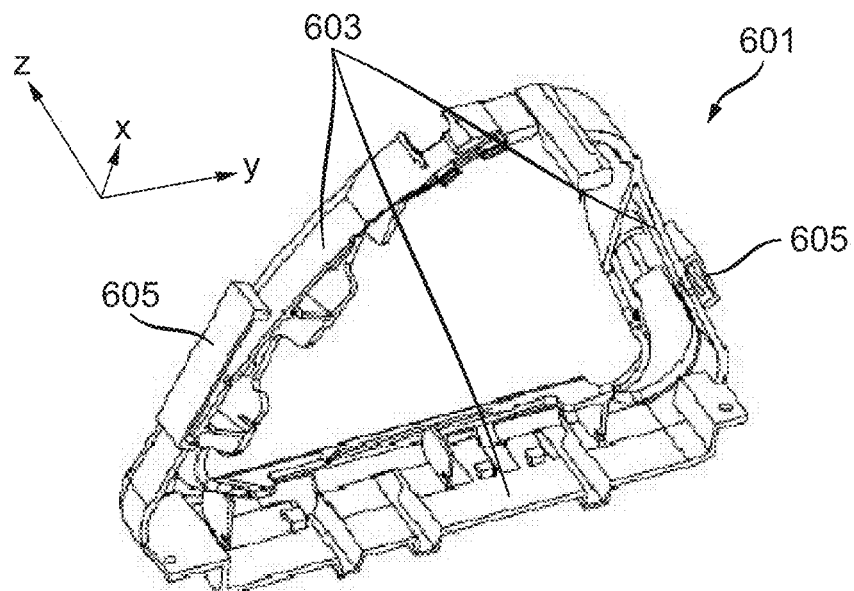
FIG. 32 shows a perspective view of a single unitary antenna bracket that supports the plurality of antennas within the electronic device according to an implementation of the present principles.
Figure 33:
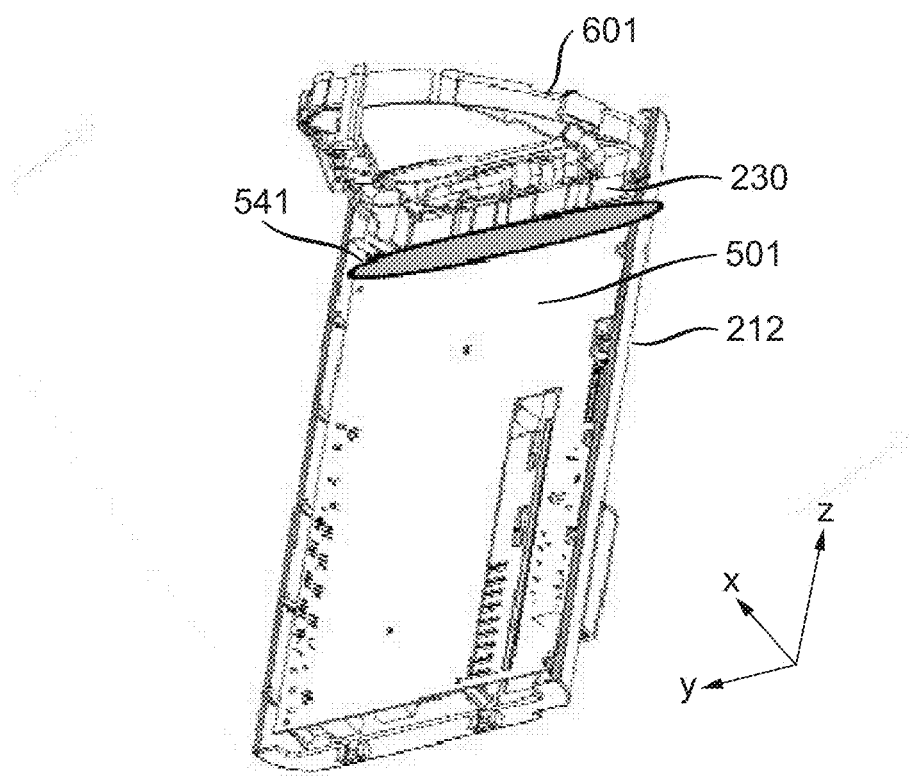
FIG. 33 shows a rear perspective view of the antenna bracket in relation to a circuit board, according to an implementation of the present principles.
Figure 36:
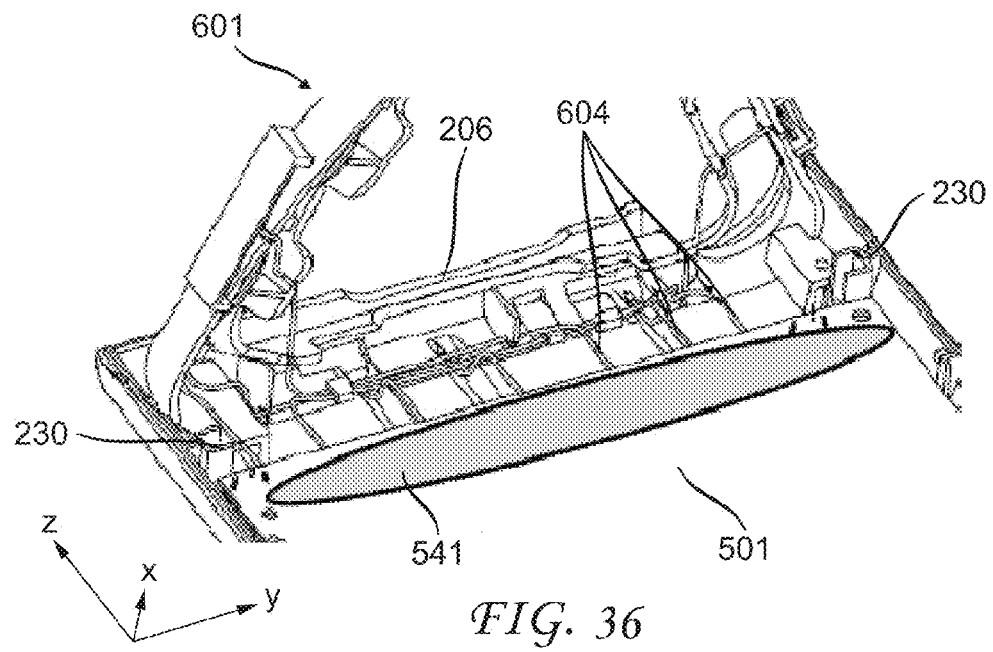
FIG. 36 shows a perspective view of the antenna bracket and the antenna wire routed to one bracket wall and toward the first printed circuit board on the rear wall of the electronic device according to an implementation of the present principles.

In view of the above mentioned issues with individual supports and the need to shield and connect antennas, a single unitary antenna bracket 601 provided and shown in FIG. 32 for holding the plurality of antennas 602 and the staging slots 230 provided and shown in FIG. 31 are helpful. The perspective view of FIG. 32 shows the antenna bracket 601 that holds multiple antennas and antenna wires 604. The antenna bracket includes multiple bracket walls or sides 603 to form a polygon structure and antenna pockets 605 supported on at least two bracket walls, wherein the antennas fit within the pockets and the pockets prevent electrostatic discharge to and/or from the antennas. The antenna bracket 601 can have rounded corners and the sides 603, and the corners can follow or generally follow the interior contour of the vertical walls of the casing. FIG. 33 shows a rear perspective view of the antenna bracket 601 in relation to the printed circuit board 501 and in relation to the staging slot 230. FIG. 36 further shows the wire securing slots region 541 in which the plurality of the wire securing slots 540 can be distributed along an end of the printed circuit board 501.

Figure 34A:
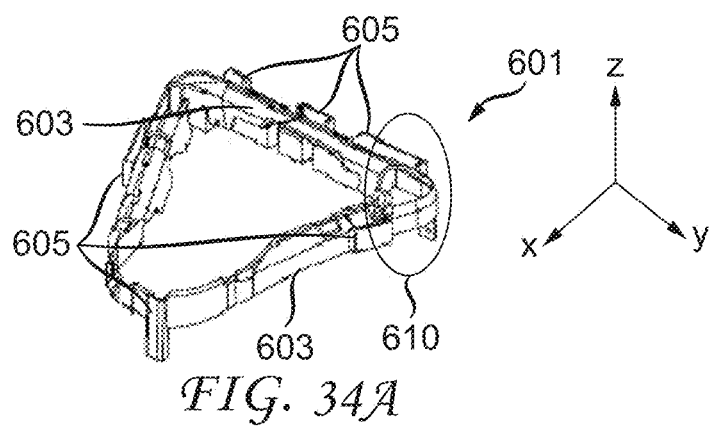
FIG. 34A shows a perspective view of the antenna bracket and the pocket therein which support the antennas according to an implementation of the present principles.
Figure 34B:
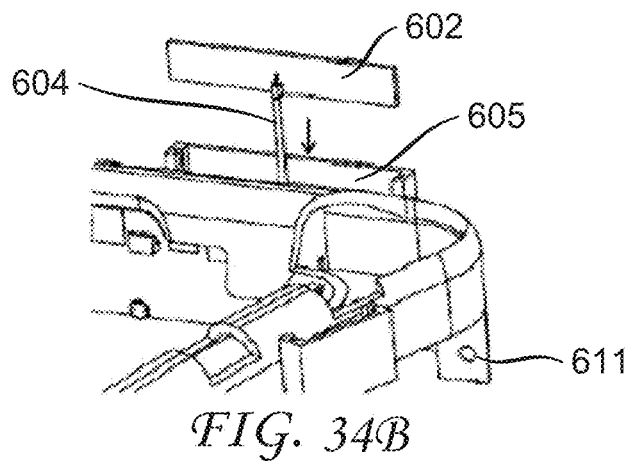
FIG. 34B shows a view of how an antenna may be inserted into an antenna pocket.
Figure 34C:
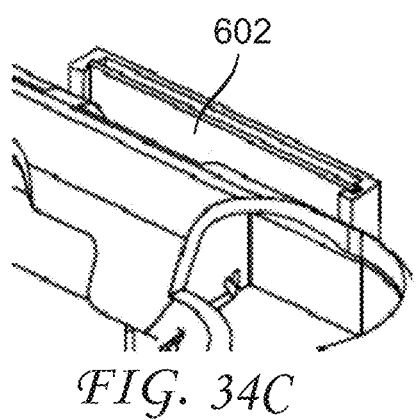
FIG. 34C shows a view after an antenna has been inserted into an antenna pocket.

FIG. 34A, FIG. 34B, and FIG. 34C show various perspective views of the antenna bracket 601 and how the antennas 602 slide into the pockets 605. In particular, the corner region 610 of the bracket 601 highlighted in FIG. 34A is enlarged in FIGS. 34B and 34C to show how the antenna 602 can be inserted into and supported by the pockets 605. The pockets 605 have a hollow structure with two broad walls parallel to the broad surfaces of the antenna and two openings. The pockets can further include two narrow opposing end walls that bridge the two broad walls. One opening can be at the top for the antenna to slide into and another opening at the bottom for the antenna wire 604 to extend through to connect preferably to one of the printed circuit boards.

Figure 35:
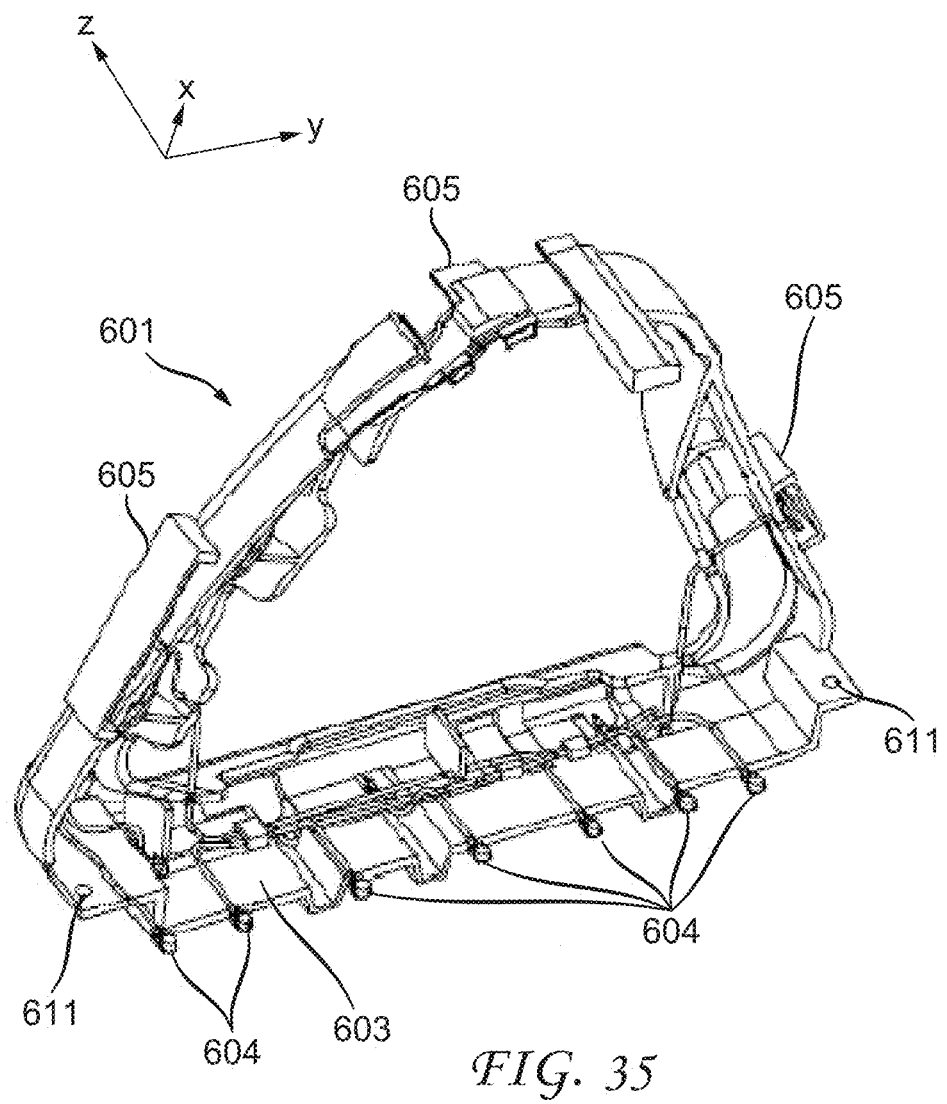
FIG. 35 shows a perspective view of the antenna bracket and the antenna wires routed to one bracket wall according to an implementation of the present principles.

FIG. 35 shows a perspective view of the antenna bracket 601 and how the antenna wires 604 can be routed to one bracket wall 603. This view, along with the view in FIG. 30, shows that the antenna wires 604 can be routed from an end of the antenna pockets 605, along the bracket walls 603 toward one of the bracket walls 603, and downward toward the antenna connector 606. Also, FIG. 35 and FIG. 34 show that the antenna bracket 601 can have mounting apertures 611 on at least one of its walls 603 to secure the bracket 601 to a wall of the housing of the electronic device or to a printed circuit board.

FIG. 36 shows a perspective view of the antenna bracket 601 and how the antenna wire 604 can be routed to one bracket wall 603 and down to the first printed circuit board 501 between the first printed circuit board 501 and the rear wall 206. The wires 604 can connect to connectors 606 at the edge of the first printed circuit board 501. This view shows that the bracket 601 and the printed circuit board can both be attached to the same wall 206 of the housing of the electronic device. FIG. 36 shows that the antenna bracket 601 can be positioned above the staging slots 230 and the printed circuit board 501 can be positioned below the staging slot 230 in the final configuration, after the antenna wires 604 are attached and the circuit board 501 is removed from the staging slots. FIG. 36 further shows the wire securing slots region 541 in which the plurality of the wire securing slots 540 can be distributed along an end of the printed circuit board 501.

Figure 37:
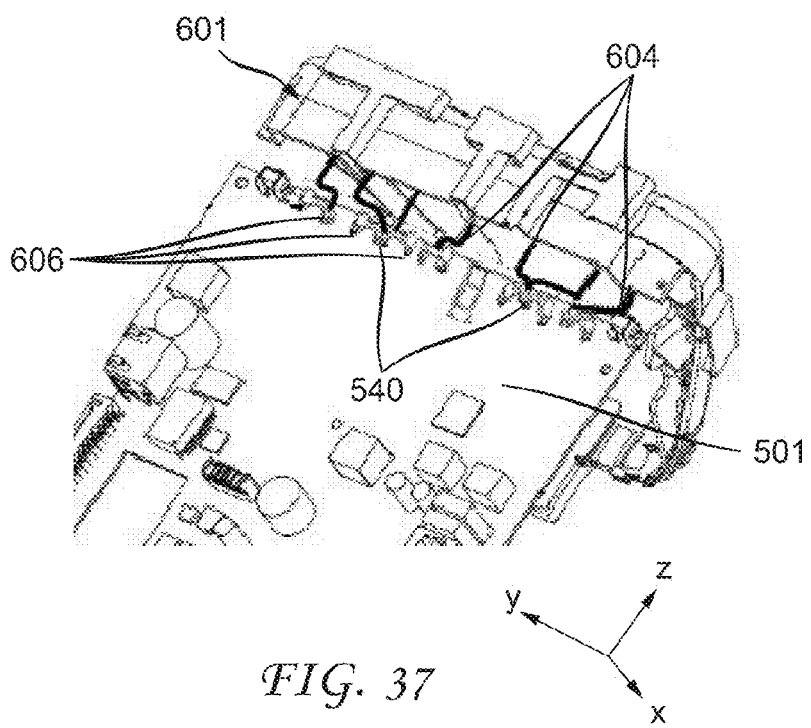
FIG. 37 shows a rear perspective view of the antenna bracket and the antenna wires routed to one bracket wall and down to the first printed circuit board, according to an implementation of the present principles.

FIG. 37 shows a rear perspective view of the antenna bracket 601 and how the antenna wire 604 can be routed to one bracket wall 603 and down to the first printed circuit board 501 and connect to antenna connector 606 at the edge of the first printed circuit board 501. This view shows that the bottom edge of the bracket wall 603 to which each of the wires 604 are routed can be separated from the top edge of the printed circuit board 501 to which the wires 604 are routed.

Although quite helpful, the implementation of the antenna bracket 601 shown in FIG. 37 has its own problems. For example, it is difficult to attach the wires 604 when the first printed circuit board 501 is already attached to rear wall 206, due to the fact that there are spatial constraints that do not allow for easy access to the side of the printed circuit board 501 that faces the rear wall 206. It is also difficult to attach the wires 604 to the connectors when the bracket 601 is already attached to the wall 206 and the circuit board is not yet attached, due to the fact that one needs to hold the circuit board 501 up with one hand and then try to connect each wire 604 individually. This is tedious and time consuming and requires great care, because the wires 604 are kept at short lengths to ensure they fit in the housing, to ensure they do not interfere or entangle with other components, and to save on material costs. Attaching the wires to the circuit board before both the bracket and circuit board are connected to the rear wall 206 is also problematic, because some wires tend to disconnect due the difficulty in handling the bracket and board together when they are separate components that are intentionally not rigidly bound together. The method 4800 in FIG. 29 addresses this problem with the introduction of the staging slots 230.

Figure 38A:
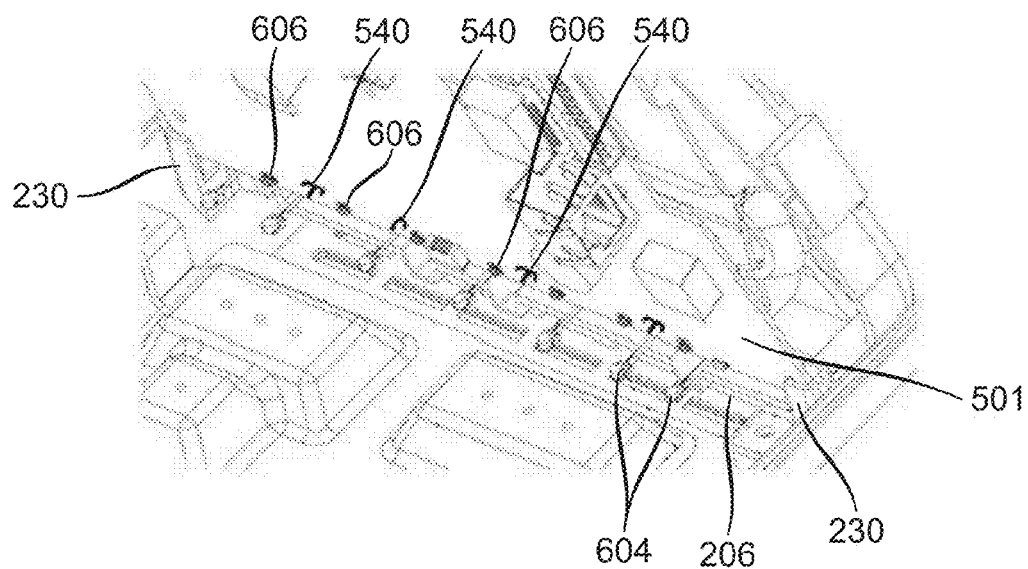
FIG. 38A shows a perspective view of the rear wall having slots thereon that facilitate easy installment of the antenna wires to the connectors on the first printed circuit board, according to an implementation of the present principles.
Figure 38B:
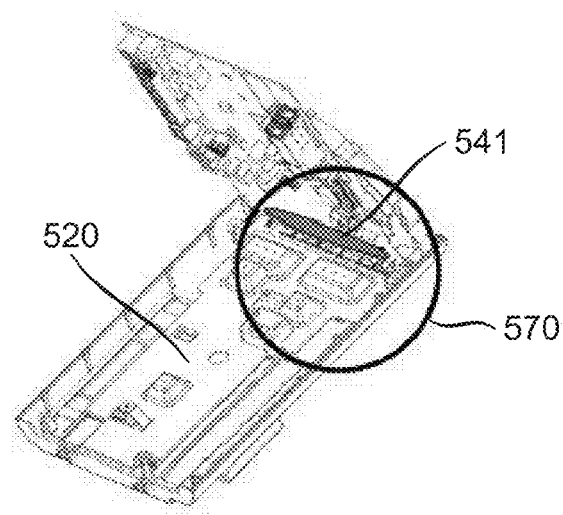
FIG. 38B shows the perspective view of the assembly of FIG. 38A where the heat sink is attached to the back wall of the electronic device.

As such, the solution to ensure easy connections of the wires 604 to the connectors 606 on the first printed circuit board 501 can be better understood with reference to FIG. 38A and FIG. 38B and the method described in FIG. 29. FIG. 38A is a magnified view of section 570 of the intermediate assembly shown in FIG. 38B. In the view shown in FIG. 38A, the antenna wires 604 are not yet inserted into the wire securing slots 540. After the board heat sink is attached to the back wall 206 as shown in FIG. 31B, the circuit board 501 can be placed in staging slots 230. As such, the rear wall 206 of the casing of the electronic device includes staging slots 230 that are adapted to support the circuit board in a vertical or upstanding position with respect to the rear wall 206, which is oriented horizontally to permit access and viewing of the underside of the printed circuit board. Once the antenna wires 604 are attached to the connectors 606, the circuit board 501 is removed from the staging slots 230 and oriented parallel to the rear wall for the remaining steps and final assembly which is shown in FIG. 31C that omits the bracket. There can be two staging slots 230 which can have C-shapes, U-shaped or V-shaped profiles in which the open ends face one another. These profiles of the staging slots can extend perpendicularly inward from the rear wall 206 to have a sufficient depth to be able to support the printed circuit board which can be parallel to the bracket 601 at point in this temporary state. FIGS. 42-46 described below show how the cover is configured and fits along the top edge of the circuit board after the wires are applied to the staging slots.

Figure 39:
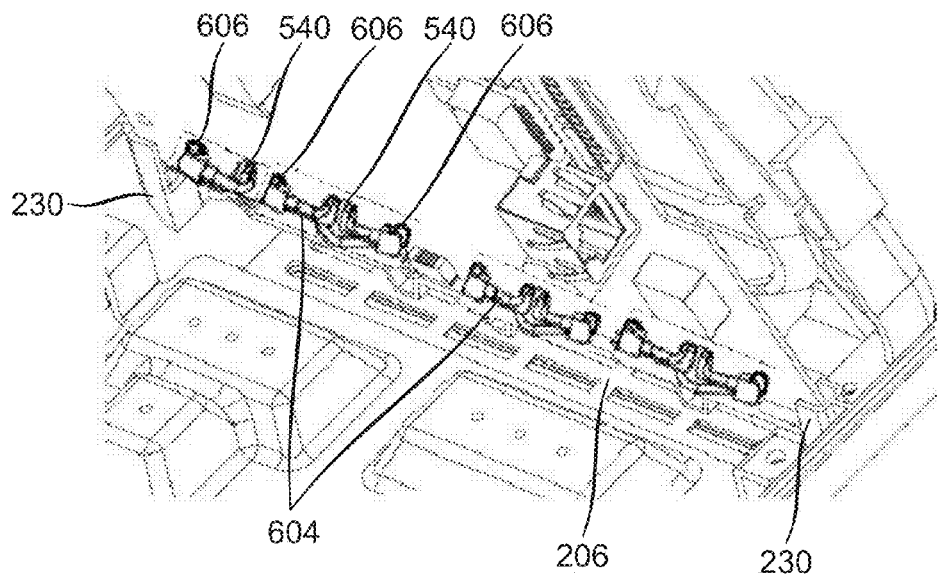
FIG. 39 shows a perspective view of the rear wall in which the antenna wires are connected to the connectors on the first printed circuit board and in which the first printed circuit board is staged in the staging slots, according to an implementation of the present principles.

FIG. 39 shows the antenna wires 604 attached to the connectors 606. At this point, the circuit board 501 can be removed from the staging slots 230 and oriented parallel to the rear wall 206 for the remaining steps and final assembly.

Figure 40:
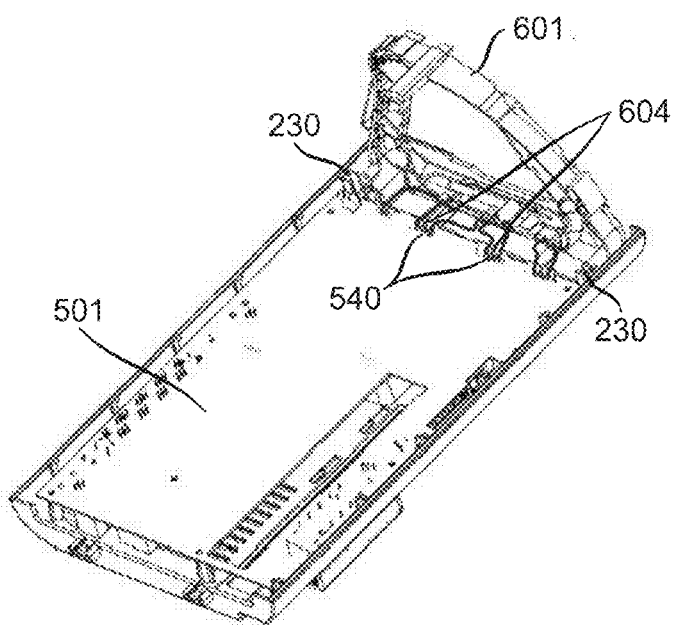
FIG. 40 shows a perspective view of the rear wall in which the first printed circuit board attached to the rear wall following the connecting of the antenna wires and the removal of the first printed circuit board from the staging slots, according to an implementation of the present principles.

FIG. 40 shows the circuit board 501 after being removed from the staging slots 230 and oriented parallel to the rear wall for the remaining step and final assembly.

Figure 41A:
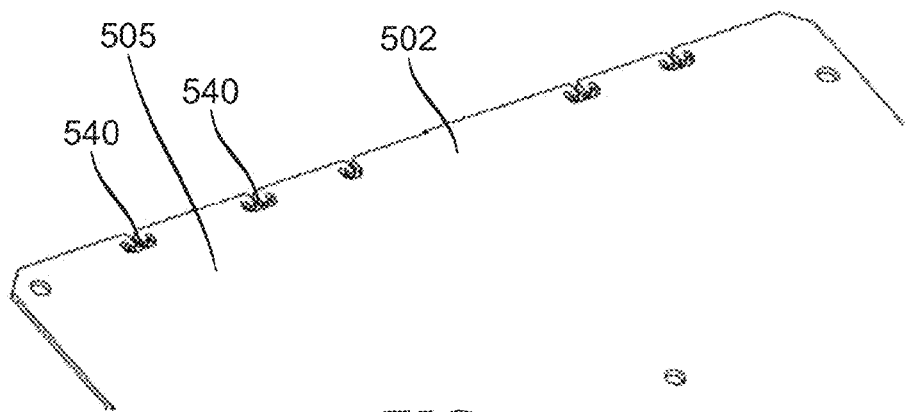
FIG. 41A shows a perspective view of the non-component side of the first printed circuit board having the wire securing slots thereon, according to an implementation of the present principles.

FIG. 41A shows a perspective view of the non-component/bottom side 505 of the first printed circuit board 501 having the wire securing slots 540 thereon.

Figure 41B:
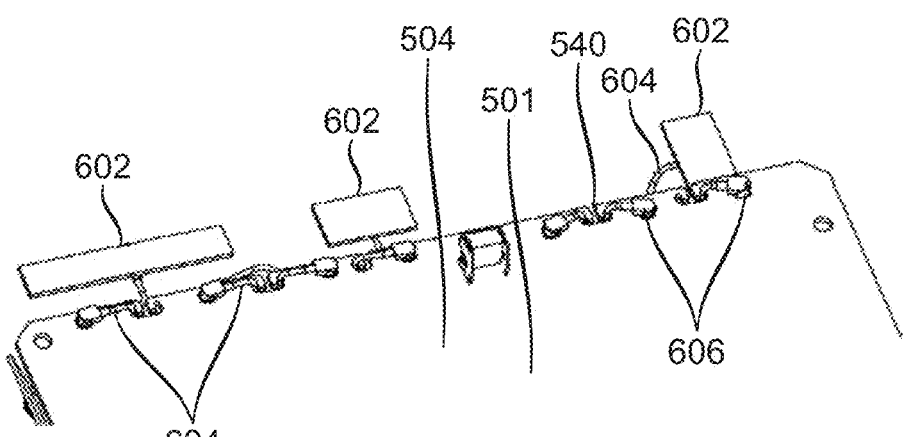
FIG. 41B shows a perspective view of the component side of a printed circuit board having the wire securing slots 540 thereon.

FIG. 41B shows a perspective view of the component side 504 of printed circuit board 501 having the wire securing slots 540 thereon.

The implementation of the wire securing slots 540 shown in FIG. 41 has been proven to be quite helpful in the assembling of the vertically oriented electronic device 200 having the antenna brackets 601. The wire securing slots 540 remove or substantially reduce the strain on the antenna wires that invariably occurs and causes some coaxial connectors of the antenna wires 604 to unplug after the plugging step. This might occur in the various methods for assembling the device. For example, in the case with the following order of steps: placing the rear wall 206 of the casing on a bench; adding or installing the heat spreader or heat sink 512 to the rear wall; adding or installing the antenna bracket 601 to the rear wall 206; placing the printed circuit board 501 on the bench; plugging the antenna wires 604 onto coaxial antenna connectors 606; the cover as shown in FIG. 42, FIG. 43, FIG. 44, FIG. 45, and FIG. 46 can then be applied to the top edge of the circuit board; adding the printed circuit board 501 with antennas 602 to the rear wall; routing the antenna wires 604 and antennas 602 to proper locations in the bracket.

With the implementation of the wire securing slots 540, the step of plugging the antenna wires can include sliding and/or securing the antenna wires 604 into the wire securing slots and placing the cover over the wires and the edge of the circuit board such that there is no strain between the antennas wire as it comes out from the wire securing slot 540 and extends to the antenna connector 606 on the printed circuit board. The retention cover shown in FIG. 42, FIG. 43, FIG. 44, FIG. 45, and FIG. 46 also assists in preventing strain by contacting the wire which steers and guides the wires. The cover can be secured with hooks that engage hook slots which can be through-hole slots laterally positioned by the cusp areas of the securing slots. The hook slots can be completely surrounded by circuit board substrate to not be a groove from the edge of the circuit board.

In sum, FIGS. 41-46 show a solution to the antenna wire strain problem. The solution is the additional step or feature of adding wire securing slots 540 on or integrated into the printed circuit board itself. As illustrated in the FIGS. 41A and 41B), there can be two types of wire securing slots 540: a single hook and a double hook cutout that curve from an edge of the printed circuit board 501. The hooks or slots of the wire securing slots 540 can have a J-shape or an L-shape cutout for the single hook type, or a T-shape cutout for the double hook type in the plane of the applicable printed circuit board. The advantage of the double hook is that one double hook takes up less room than 2 single hooks to accommodate two wires. If the L-shape is used and a single cutout is desired to accommodate two wires, a T-shape can be employed. The orientation of the T-shape would be inverted (i.e., upside down T) compared to the upright L-shape or the J-shape. The feature of the wire securing slots 540 can be incorporated with any of the assembly process.

One aspect of the present principles is that the J-space or L-shape cutout or slot permits the edge of the printed circuit board 501 to hold the wire while the end of the wire 604 is connected. The J-space or L-shape cutout/slot grasps or holds the wire securely to permit the manipulation of the dangling or free portion of the antenna wire 604. The J-shape cutout/slot can include a flat bottom portion at the bottom of the J and a short curled portion (upward portion). The opening of the cutout/slot width must be large enough to accommodate the width of the wire; however, it is contemplated that the wire securing slot 540 can taper down to a width smaller than the width of the wire so the wire can be gripped tighter as the wire is advanced in the slot. The wire 602 can be secured in the wire securing slots 540 by pushing the wire into the slot in a direction in the plane of the board and parallel to the linear part of the J-shape cutout/slot near the opening. The downward portion of the J-shape or L-shape cutout/slot can be perpendicular to the edge of the printed circuit board. The antenna wire 602 can remain in the wire securing cutout/slot 540 after the connection to the connector 606. The wire 602 can rest at the bottom of the J-shape or L-shape cutout/slot, or can rest at the short curled up portion of the J-shape slot if the J-shape cutout/slot is employed. Although a J-shape and an L-shape have been disclosed here, other effective shapes are also possible that can include some longer entrance portion (downward portion), some bottom portion or cusp portion and some upward portion back toward the edge of the board. For example, different versions of a check design (✓) can be utilized, which can include one or both strokes (i.e. upward and downward) at an acute angle with the edge of the printed circuit board or one stroke perpendicular to the edge of the printed circuit board.

The FIG. 42, FIG. 43, FIG. 44, FIG. 45, and FIG. 46 show how the retention cover enhances the effectiveness of the various wire securing slots. In accordance with one implementation, the retention cover 700 is generally U-shaped, where one leg 701 of the U is on the non-connector side, and the other leg 704 of the U is on the connector side of the PCB 501, and the base portion 709 of the U covers or straddles the edge of the PCB once the retention cover is installed. In accordance with the present principles, the retention cover can be made of any type of plastic that has good insulating qualities (non-conductive). In addition, the plastic material should be flexible enough for the snap fittings to the PCB work and do not fatigue or break over time.

Figure 42:
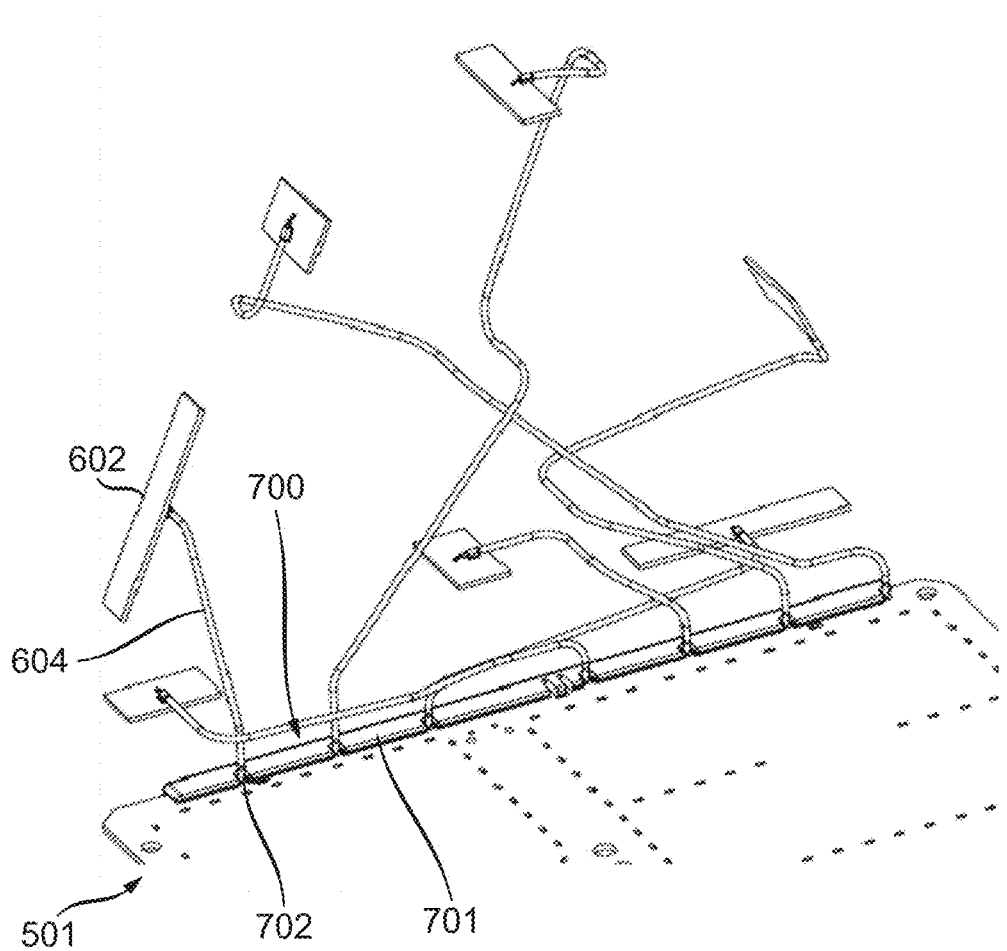
FIG. 42 shows a perspective view of the non-component side of the printed wiring board and a wire retention cover, according to other implementations of the present principles.
Figure 43:
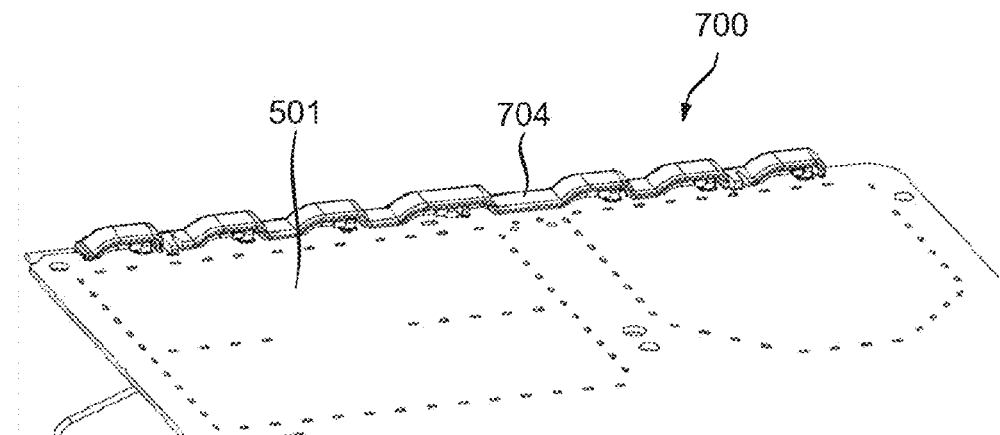
FIG. 43 shows a perspective view of the component side of the printed wiring board and a wire retention cover.

FIG. 42 shows the non-connector side of the PCB 501 with the non-connector side 701 of the retention cover 700 positioned on the edge thereof, according to an implementation of the present principles. The non-connector side 701 of the retention cover 700 is generally planar and has wire receiving slots 702 which are positioned to align with the wire securing cutouts/slots 540 in the PCB 501. The wire receiving slots 702 allow the retention cover to be positioned on the edge of the PCB such that antenna wires 604 pass through them allowing the various antennas 602 to be positioned during the staging process of assembly. FIG. 43 shows the retention cover 700 from the connector side of the PCB 501. As shown, the connector side 704 of retention cover 700 includes raised surfaces 708 and lower surfaces 706.

Figure 44:
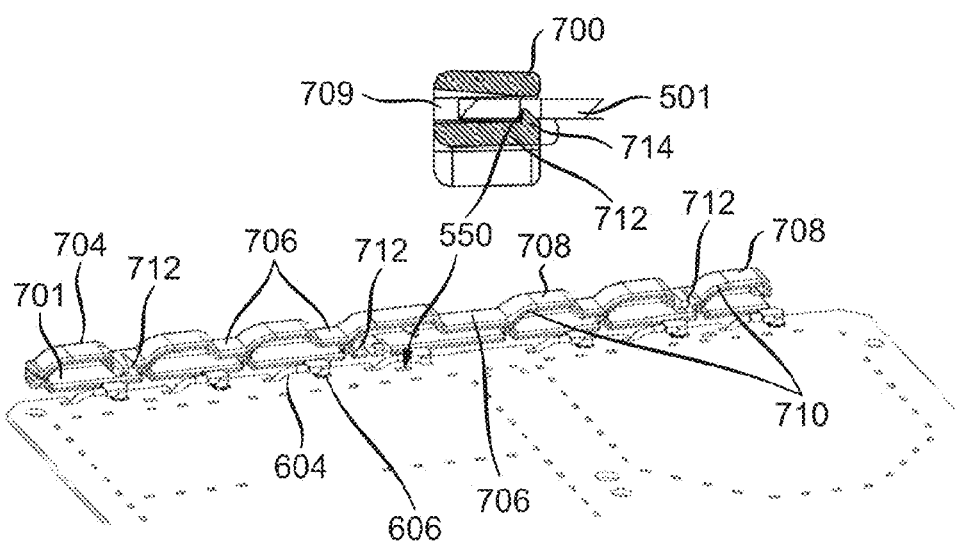
FIG. 44 shows a perspective view of the non-component side of the printed wiring board and a hook feature of the wire retention cover
Figure 45:
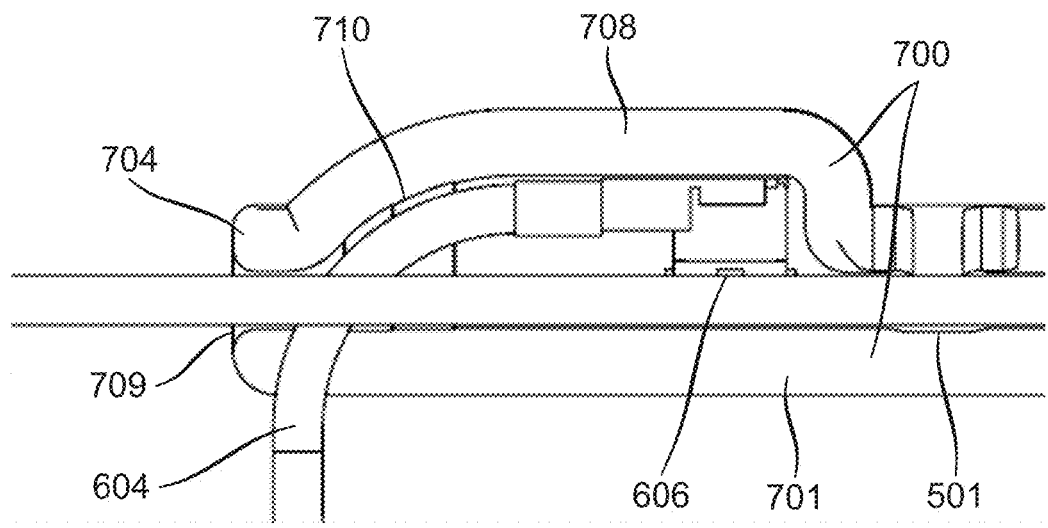
FIG. 45 shows an enlargement of a portion of the retention cover of FIG. 44.

FIG. 44, and FIG. 45 show the retention cover 700 removed from the edge of the PCB. The connector side portion 704 has raised portions or surfaces 708 and lower portions or surfaces 706. The raised portions/surfaces 708 are convex in shape and have an interior or underside radius that is configured to contain the wire 604 as the wire rounds over an edge of a channel in the circuit board 501 to ensure that the wire follows the interior radius 710 of the underside of the convex shape of the raised portion/surface 708 to insure that the wire 604 does not crimp or bend too sharply which can damage the wire or change its impedance or other electrical properties. As will be apparent from the Figures, the coaxial connector 606 are completely engaged (i.e., connected to the PCB 501) in order for the retention cover 700 to be assembled onto the edge of the PCB. The raised portions/surfaces 708 have sufficient clearance to "cover" the coaxial connection 606 when the retention cover is in its operable position over the edge of the PCB 501.

One or more hooks 712 are provided on either lower portions/surfaces 706 of the connector side portion 704 of the retention cover 700 and/or on the non-connector side 701 of the retention cover 700. The non-connector side implementation of hook 712 is shown in FIG. 44. The hooks 712 have a protrusion 714 that is configured to snap into an aperture 550 on the PCB so as to secure the retention cover 700 in place. (See enlarged portion of FIG. 44). Those of skill in the art will appreciate that the positioning of the apertures 550 and corresponding hooks 712 of the retention cover 700 can be modified depending on the desired application and/or particular needs of a specific design.

Figure 46A:
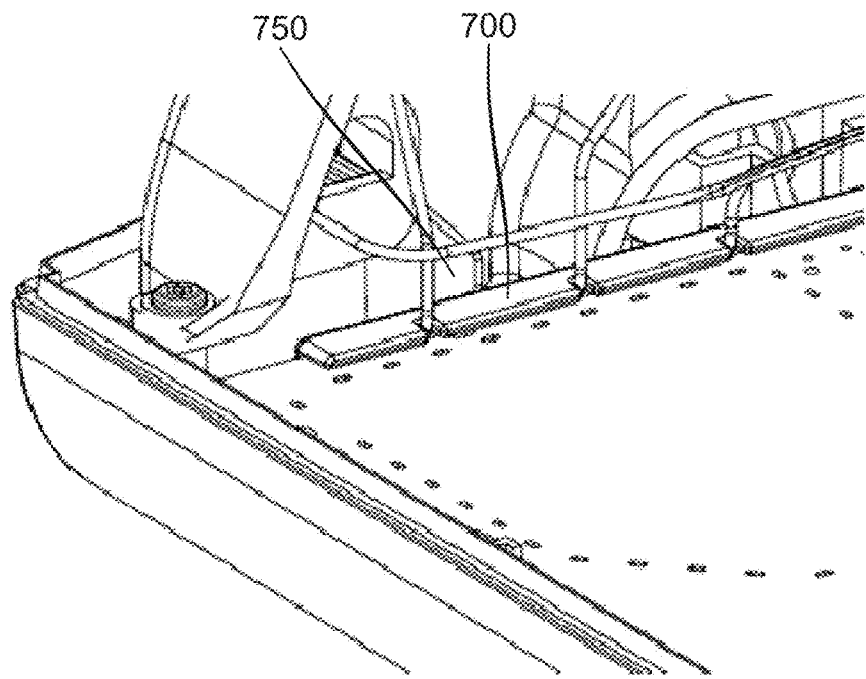
FIG. 46A shows a final assembly view of the wire retention cover.
Figure 46B:
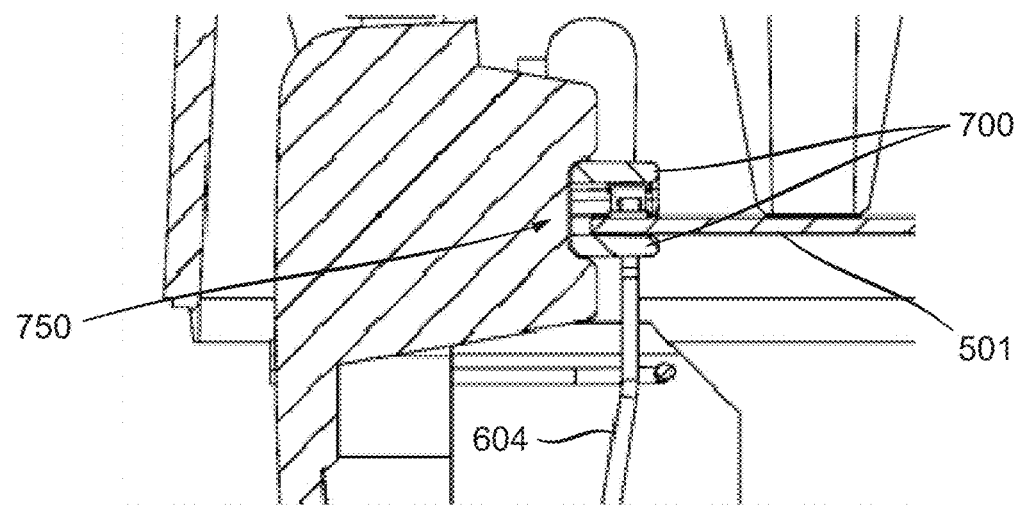
FIG. 46B shows an anchor rib feature of the retention cover.

FIG. 46A and FIG. 46B show the final assembly of the retention cover 700, according to an implementation of the present principles. Once the retention cover 700 is positioned as shown in FIGS. 42-43 and 45, an anchor rib 750 is positioned to hold the cover 700 in place to prevent disengagement during drop and vibration testing of the electronic device. The anchor rib 750 includes a recess 752 configured to fit over the retention cover 700 (See FIG. 46B). The other side of the anchor rib is secured against the casing or other stationary part of the electronic device housing, and thereby operates to secure the retention cover 700 in place. The anchor rib 750 could be removed after drop and vibration testing is completed and the product sold to the user public.

It should be noted that all examples and conditional language recited herein are intended for pedagogical purposes to aid the reader in understanding the present principles and the concepts contributed by the inventors to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope of the present principles. All such changes and modifications are intended to be included within the scope of the present principles. For example, although the embodiments generally refer to the components with a vertically oriented electronic device in which the vertical height of the device can be greater than the horizontal length of each of the side walls, the principles are intended to be useful and are intended to include horizontally oriented electronic device.

Additionally, although the sides of the vertically oriented electronic device as well as other components are characterized as being "vertical" or "vertically oriented," it should be understood that these expression are intended to include surfaces which may have some curvature or some small deviations from being completely vertical (e.g. +/−10° from vertical can be considered vertical).

Also, it is intended that the expressions "rear" and "front," the expressions "top" and "bottom," and the expressions "vertical" and "horizontal," as well as other complementary terms are intended to be construed from the perspective of the observer of the figures; and as such, these expression can be interchanged depending upon the direction that the observer observes the device.

What is claimed is:

1. A cover in an electronic device comprising:
    the cover having a U-shape configured to fit over an edge of a printed circuit board, the U-shape cover further comprising:
    a first leg adapted to face a non-connector side portion of the printed circuit board and comprising at least one slot positioned at a point along the first leg, the at least one slot receiving an antenna wire; and
    a second leg adapted to face a connector side portion of the printed circuit board and comprising a plurality of raised surfaces and a plurality of lower surfaces, the raised surfaces fitting over and protecting antenna wires and antenna wire connectors.

2. The cover according to claim 1, wherein the raised surfaces are convex in shape and have a radius of curvature on an underside thereof, the radius of curvature preventing crimping or bending of an antenna wire.

3. The cover according to claim 1, further comprising hooks positioned on at least one of the first leg and the second leg, the hooks being aligned with corresponding apertures in the printed circuit board, the hooks having a protrusion configured to be received by the apertures to secure the retention cover to the printed circuit board.

4. The cover according to claim 1, wherein the printed circuit board comprises at least one wire securing slot configured to receive an antenna wire and retain the antenna wire in place during assembly of an electronic device.

5. The cover according to claim 4, wherein the at least one wire securing slot is one of J-shaped, L- shaped or T-shaped.

6. A cover for a printed circuit board contained within an electronic device, the printed circuit board having a connector side and a non-connector side, the wire retention cover comprising:
    a first leg configured to be positioned on the non-connector side of the printed circuit board, the first leg having at least one slot positioned at a point along the first leg for receiving an antenna wire;
    a second leg connected to the first leg configured to be positioned on the connector side of the printed circuit board; and
    a base portion connecting the first leg to the second leg, the base portion covering an edge of the printed circuit board when the cover is installed.

7. The cover according to claim 6, wherein the second leg comprises a plurality of raised surfaces and a plurality of lower surfaces; the raised surfaces fitting over and protecting antenna wires and antenna wire connections.

8. The cover according to claim 7, wherein the raised surfaces are convex in shape and have a radius of curvature on an underside thereof, the radius of curvature preventing crimping or bending of an antenna wire.

9. The cover according to claim 6, further comprising hooks positioned on at least one of the first leg and the second leg, the hooks being aligned with corresponding apertures in the printed circuit board and having a protrusion configured to be received by the apertures to secure the retention cover to the printed circuit board.

10. The cover according to claim 6, wherein the printed circuit board comprises at least one wire securing slot configured to receive and retain an antenna wire in place during assembly of the electronic device.

11. The cover according to claim 10, wherein the at least one wire securing slot is one of J-shaped, L-shaped or T-shaped.

12. An electronic device comprising:
    a printed circuit board having wire securing slots along an edge of the printed circuit board and electrical connectors on an upper side of the printed circuit board adjacent to the edge; and
    electronic components having wires extending therefrom, the wires each being secured in one of the wire securing slots and connected to one of the electrical connectors;
    a cover having a first leg and a second leg, wherein the first leg of the cover overlays the wires extending through the wire securing slots on the first leg of the printed circuit board, and wherein the second leg overlays an opposite side of the printed circuit board.

13. The electronic device of claim 12, wherein the first leg includes a radius of curvature of a respective wire extending through a respective wire securing slot.

14. The electronic device of claim 12, wherein the cover includes at least one hook having a protrusion which inserts into a slot of the printed circuit board, wherein the hook inserted into the slot retains the cover in place.

15. The electronic device of claim 12, further comprising an anchor rib positioned to hold the cover in place.

* * * * *